(12) United States Patent
Hua et al.

(10) Patent No.: US 11,081,524 B2
(45) Date of Patent: Aug. 3, 2021

(54) THREE-DIMENSIONAL MEMORY DEVICES

(71) Applicant: YANGTZE MEMORY TECHNOLOGIES CO., LTD., Wuhan (CN)

(72) Inventors: Wenyu Hua, Wuhan (CN); Linchun Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/542,266

(22) Filed: Aug. 15, 2019

(65) Prior Publication Data

US 2020/0286958 A1 Sep. 10, 2020

Related U.S. Application Data

(63) Continuation of application No. PCT/CN2019/076827, filed on Mar. 4, 2019.

(51) Int. Cl.
*H01L 27/24* (2006.01)
*G11C 11/16* (2006.01)
(Continued)

(52) U.S. Cl.
CPC ...... *H01L 27/2481* (2013.01); *G11C 11/1657* (2013.01); *H01L 27/0688* (2013.01);
(Continued)

(58) Field of Classification Search
CPC .......... H01L 27/2481; H01L 27/0688; H01L 27/11529; H01L 27/1157; H01L 27/11582
(Continued)

(56) References Cited

U.S. PATENT DOCUMENTS 8,426,306 B1   4/2013 Gee et al.
9,318,206 B2   4/2016 Dong et al.
(Continued)

FOREIGN PATENT DOCUMENTS

CN   103620789 A   3/2014
CN   104170061 A   11/2014
(Continued)

OTHER PUBLICATIONS

International Search Report issued in corresponding International Application No. PCT/CN2019/076827, dated Dec. 3, 2019, 5 pages.
(Continued)

*Primary Examiner* — Sheikh Maruf
(74) *Attorney, Agent, or Firm* — Bayes PLLC

(57) ABSTRACT

Embodiments of 3D memory devices and methods for forming the same are disclosed. In an example, a 3D memory device includes a substrate and a memory stack including interleaved conductive layers and dielectric layers above the substrate. The 3D memory device also includes a slit structure extending vertically through the memory stack and extending laterally along a serpentine path to separate the memory stack into a first area and a second area. The 3D memory device further includes first channel structures each extending vertically through the first area of the memory stack and including a drain at its upper end, and second channel structures each extending vertically through the second area of the memory stack and including a source at its upper end. The 3D memory device further includes semiconductor connections disposed vertically between the substrate and the memory stack. Each semiconductor connection crosses the slit structure in a plan view to electrically connect a respective pair of first and second channel structures.

20 Claims, 11 Drawing Sheets

(51) Int. Cl.
  *H01L 27/06* (2006.01)
  *H01L 27/11529* (2017.01)
  *H01L 27/1157* (2017.01)
  *H01L 27/11582* (2017.01)

(52) U.S. Cl.
  CPC .... *H01L 27/1157* (2013.01); *H01L 27/11529* (2013.01); *H01L 27/11582* (2013.01)

(58) Field of Classification Search
  USPC .............................................................. 257/4
  See application file for complete search history.

(56) References Cited

U.S. PATENT DOCUMENTS

| | | | |
|---|---|---|---|
| 10,141,328 B2 | 11/2018 | Lue et al. | |
| 2009/0283819 A1* | 11/2009 | Ishikawa | H01L 29/4234 257/324 |
| 2010/0120214 A1* | 5/2010 | Park | H01L 27/11578 438/287 |
| 2010/0155810 A1* | 6/2010 | Kim | H01L 29/792 257/316 |
| 2010/0213527 A1* | 8/2010 | Shim | H01L 27/11582 257/314 |
| 2012/0001249 A1* | 1/2012 | Alsmeier | H01L 27/1157 257/319 |
| 2012/0153372 A1* | 6/2012 | Kim | H01L 27/11582 257/314 |
| 2012/0248399 A1* | 10/2012 | Sasago | H01L 27/2454 257/4 |
| 2014/0097484 A1* | 4/2014 | Seol | H01L 27/1157 257/324 |
| 2014/0166963 A1* | 6/2014 | Lee | H01L 27/11556 257/4 |
| 2014/0187029 A1* | 7/2014 | Seol | H01L 27/11582 438/586 |
| 2014/0225181 A1* | 8/2014 | Makala | H01L 29/66825 257/321 |
| 2015/0054058 A1* | 2/2015 | Seol | H01L 29/42332 257/324 |
| 2015/0179662 A1* | 6/2015 | Makala | H01L 27/11578 257/314 |
| 2015/0255485 A1* | 9/2015 | Kameoka | H01L 27/11556 257/314 |
| 2015/0380418 A1* | 12/2015 | Zhang | H01L 27/11529 257/326 |
| 2015/0380422 A1* | 12/2015 | Sharangpani | H01L 21/02238 365/185.17 |
| 2016/0020255 A1* | 1/2016 | Ratnam | G11C 7/12 257/4 |
| 2016/0072058 A1* | 3/2016 | Samachisa | H01L 27/2436 365/163 |
| 2016/0190152 A1 | 6/2016 | Fukuzumi et al. | |
| 2016/0276360 A1* | 9/2016 | Doda | H01L 29/66666 |
| 2017/0040416 A1* | 2/2017 | Ota | H01L 27/11575 |
| 2017/0103994 A1 | 4/2017 | Fukuzumi et al. | |
| 2017/0179026 A1* | 6/2017 | Toyama | H01L 27/11573 |
| 2017/0236873 A1* | 8/2017 | Chen | H01L 45/04 438/382 |
| 2017/0278936 A1 | 9/2017 | Namkoong et al. | |
| 2018/0006051 A1 | 1/2018 | Nagashima et al. | |
| 2018/0033799 A1* | 2/2018 | Kanamori | H01L 27/11582 |
| 2018/0233512 A1 | 8/2018 | Van Houdt et al. | |
| 2018/0261575 A1 | 9/2018 | Tagami et al. | |
| 2018/0261623 A1 | 9/2018 | Higashi et al. | |
| 2018/0277497 A1 | 9/2018 | Matsuo | |
| 2019/0006386 A1* | 1/2019 | Yamazaki | H01L 27/1157 |

FOREIGN PATENT DOCUMENTS

| | | |
|---|---|---|
| CN | 104541370 A | 4/2015 |
| CN | 105047682 A | 11/2015 |
| CN | 106057813 A | 10/2016 |
| CN | 107464817 A | 12/2017 |
| CN | 107591405 A | 1/2018 |
| CN | 107658315 A | 2/2018 |
| CN | 108377660 A | 8/2018 |
| CN | 108807411 A | 11/2018 |
| CN | 109155313 A | 1/2019 |
| CN | 109256392 A | 1/2019 |
| CN | 109314116 A | 2/2019 |
| CN | 109314118 A | 2/2019 |
| CN | 109346479 A | 2/2019 |
| CN | 109378315 A | 2/2019 |
| CN | 109417074 A | 3/2019 |
| CN | 110140214 A | 8/2019 |
| JP | 2018182320 A | 11/2018 |
| TW | 201834221 A | 9/2018 |
| TW | 201901932 A | 1/2019 |
| WO | 2018058812 A1 | 4/2018 |

OTHER PUBLICATIONS

Written Opinion of the International Searching Authority issued in corresponding International Application No. PCT/CN2019/076827, dated Dec. 3, 2019, 5 pages.
International Search Report issued in corresponding International Application No. PCT/CN2019/076828, dated Dec. 17, 2019, 4 pages.
Written Opinion of the International Searching Authority issued in corresponding International Application No. PCT/CN2019/076828, dated Dec. 17, 2019, 4 pages.

* cited by examiner

THREE-DIMENSIONAL MEMORY DEVICES

CROSS REFERENCE TO RELATED APPLICATION

This application is continuation of International Application No. PCT/CN2019/076827, filed on Mar. 4, 2019, entitled "THREE-DIMENSIONAL MEMORY DEVICES," which is hereby incorporated by reference in its entirety. This application is also related to U.S. application Ser. No. 16/542,269, filed on even date, entitled "METHODS FOR FORMING THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In an example, a 3D memory device includes a substrate and a memory stack including interleaved conductive layers and dielectric layers above the substrate. The 3D memory device also includes a slit structure extending vertically through the memory stack and extending laterally along a serpentine path to separate the memory stack into a first area and a second area. The 3D memory device further includes a plurality of first channel structures, each first channel structure extending vertically through the first area of the memory stack and including a drain at its upper end, and a plurality of second channel structures, each second channel structure extending vertically through the second area of the memory stack and including a source at its upper end. The 3D memory device further includes a plurality of semiconductor connections disposed vertically between the substrate and the memory stack. Each semiconductor connection crosses the slit structure in a plan view to electrically connect a respective pair of first channel structure and second channel structure.

In another example, a 3D memory device includes a slit structure extending along a serpentine path in a plan view and an array of memory strings. Each memory string includes a first channel structure including a source at its upper end, a second channel structure including a drain at its upper end, and a semiconductor connection connecting lower ends of the first and second channel structures. In the plan view, the semiconductor connection crosses the slit structure, and the source and the drain of the memory string are separated by the slit structure in a column direction.

In still another example, a 3D memory device includes a substrate, a bonding interface above the substrate, a semi-conductor connection above the bonding interface, and a memory stack including interleaved conductor layers and dielectric layers above the semiconductor connection. The 3D memory device also includes a first channel structure and a second channel structure each extending vertically through the memory stack. A lower end of the first channel structure and a lower end of the second channel structure are in contact with the semiconductor connection. The 3D memory device further includes a bit line contact and a source line contact each above and in contact with an upper end of the first channel structure and an upper end of the second channel structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
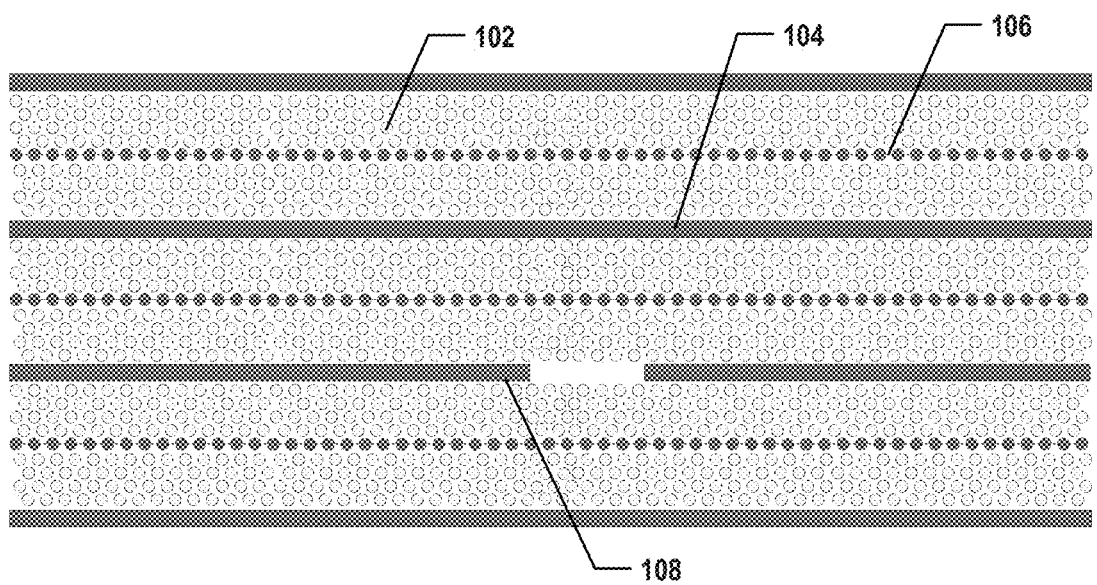
FIG. 1 illustrates a plan view of an exemplary 3D memory device.
Figure 1:

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, slit structures, such as gate line slits (GLSs), are used as source contacts for wiring the array common source (ACS) of multiple memory strings, which is formed below the memory stack, while the drains are formed at the upper ends of the memory strings above the memory stack. GLSs may consume large chip size due to its fillings of multiple layers of spacers and conductors. To form the electrical connections between the memory strings and the ACS, various challenging and high-cost processes need to perform, such as silicon-silicon oxide-silicon nitride-silicon oxide (SONO) punch and selective epitaxial growth (SEG). Moreover, as the GLSs in the existing 3D NAND memory devices all have a pattern of parallel straight lines in the plan view, the distances for depositing gate line materials (e.g., tungsten) to different memory strings are not the same during the gate replacement processes, which makes the electrical performance of different memory strings inconsistent.

For example, FIG. 1 illustrates a plan view of an exemplary 3D memory device 100. 3D memory device 100 includes an array of NAND memory strings 102 and multiple parallel GLSs 104, which divide array of NAND memory strings 102 into different memory regions (e.g., memory blocks). 3D memory device 100 also includes multiple parallel top select gate (TSG) cuts 106 that separate the electrical connections between TSGs of NAND memory strings 102 in different regions. TSGs are used for controlling the drains on top of each NAND memory string 102. As shown in FIG. 1, each GLS 104 and each TSG cut 106 extend laterally along the word line direction in a straight-line pattern in the plan view (parallel to the wafer plane). In other words, each GLS 104 extends laterally along a straight path. It is noted that x and y axes are included in FIG. 1 to illustrate two orthogonal directions in the wafer plane. The x-direction is the word line direction, and the y-direction is the bit line direction. GLS 104 includes a conductor layer and works as the ACS contact of multiple NAND memory strings 102. 3D memory device 100 also includes "H" cuts 108 that laterally separate each memory block into multiple memory fingers. During the gate replacement processes, conductive materials for forming the gate lines of NAND memory strings 102 need to travel a relatively long distance between each GLS 104 and adjacent TSG cuts 106, which can be challenging for high-quality deposition.

Various embodiments in accordance with the present disclosure provide an improved 3D memory device architecture and fabrication method thereof. The lower ends of a pair of channel structures can be connected by a semiconductor connection to form a U-shaped memory string (in the side view), such that the upper ends of the pair of channel structures can be used as the source and drain of the memory string, respectively. In some embodiments, the distance between the source and the drain of each memory string is the same, thereby ensuring the consistency of the electrical performance of different memory strings. By eliminating the ACS under the memory stack, the slit structures no longer need to work as the source contact, thereby reducing its size and simplifying the fabrication process. The current leakage between the ACS and gate lines can be avoided as well by filling the slit structures with dielectric materials. Moreover, some challenging and expensive processes, such as SONO punch and SEG, can be eliminated to simplify the process and increase the yield.

Figure 2:
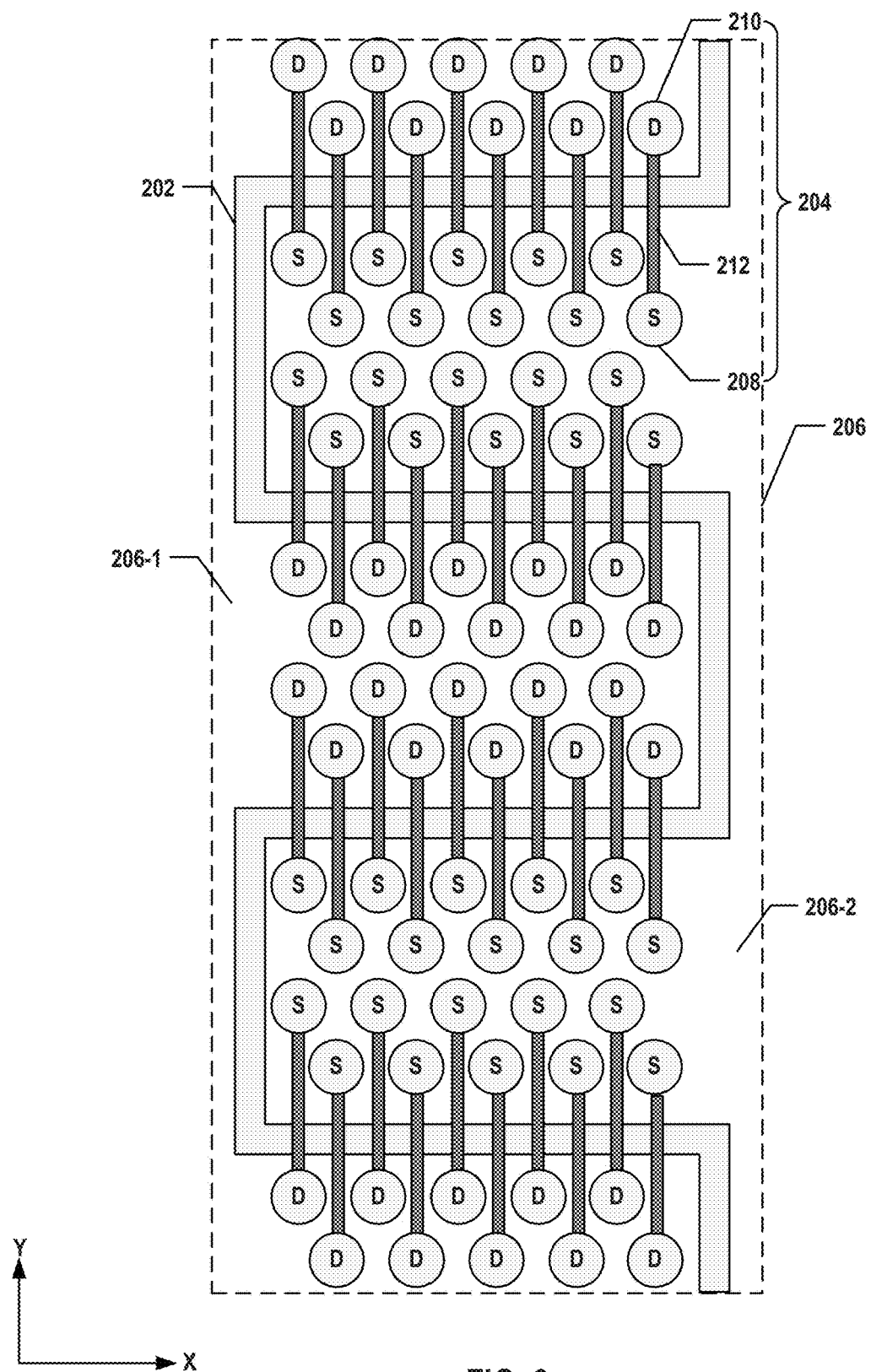
FIG. 2 illustrates a plan view of an exemplary 3D memory device, according to some embodiments of the present disclosure.

FIG. 2 illustrates a plan view of an exemplary 3D memory device 200, according to some embodiments of the present disclosure. FIG. 2 shows the arrangement of a slit structure 202 and an array of memory strings 204 (e.g., NAND memory strings) in the plan view (parallel to the wafer plane). Slit structure 202 and memory strings 204 can be formed in an inner region (also known as "core array region") of a memory stack 206. As shown in FIG. 2, slit structure 202 extends laterally along a serpentine path in the plan view to separate memory stack 206 into a first area 206-1 and a second area 206-2, according to some embodiments. For example, slit structure 202 may extend along the y-direction for a first distance, turn to the x-direction for a second distance, turn back to the y-direction again for the first distance, and turn to another x-direction for the second distance, and so on and so forth. It is understood that the serpentine path described herein is not limited to the example shown in FIG. 2, which turns between x-direction and y-direction. The serpentine path can include any other suitable twisting courses that can separate memory stack 206 into first and second areas 206-1 and 206-2. In some embodiments, slit structure 202 is a continuous slit opening extending vertically through memory stack 206 and filled with one or more dielectrics, such as silicon oxide, to electrically separate the conductor layers (e.g., gate lines/word lines) in first and second areas 206-1 and 206-2 of memory stack 206, as described below in detail. Different from 3D memory device 100 in FIG. 1 in which GLSs 104 are used as the ACS contacts, slit structure 202 does not include a conductor layer for interconnecting the sources of memory strings 204. Thus, the dimension of slit structure 202 in FIG. 2 can be reduced compared with GLS 104 in FIG. 1 to save chip area, and the current leakage through GLS 104 can be avoided.

As shown in FIG. 2, memory strings 204 can be arranged in an array having rows and columns in the plan view. Each memory string 204 can include a first channel structure (a source channel structure 208) including a source (S) at its upper end and a second channel structure (a drain channel structure 210) including a drain (D) at its upper end. Each memory string 204 can further include a semiconductor connection 212 connecting lower ends of source and drain channel structures 208 and 210. As shown in FIG. 2, in the plan view, each semiconductor connection 212 crosses slit structure 202, and source channel structures 208 and drain channel structures (and the sources and drain of memory string 204) are separated by slit structure 202 in a column direction (e.g., the y-direction in FIG. 2). That is, each memory string 204 is disposed in both first and second areas 206-1 and 206-2 of memory stack 206, according to some embodiments. Each source channel structure 208 can be formed in second area 206-2 of memory stack 206, and each drain channel structure 210 can be formed in first area 206-1 of memory stack 206. For example, source channel structures 208 and drain channel structures 210 may be disposed on different sides of slit structure 202 in the column direction in the plan view. In some embodiments, the distances between the sources and the drains of respective memory strings 204 (i.e., each distance between a pair of source and drain channel structures 208 and 210 of memory string 204) in the plan view are nominally the same. In other words, the lengths of each semiconductor connection in the column direction can be the nominally the same. As a result, the uniformity of electrical performance of each memory string 204 can be improved.

In the column direction, memory strings 204 (and channel structures thereof) can be aligned. Every N sources and N drains can alternate in each column of array of memory strings 204, where N is a positive integer greater than 1. In some embodiments, every two sources and two drains alternate in each column of array of memory strings 204. That is, in each column, the channel structures can be arranged following the repeating pattern of S-S-D-D or D-D-S-S. In the row direction, memory strings 204 (and channel structures thereof) can be staggered to increase the memory cell density. For example, as shown in FIG. 2, every two rows of memory strings 204 may stagger with each other. In the plan view, source channel structures 208 can be disposed in M rows, and drain channel structures 210 can be disposed in M rows as well, where M is a positive even number greater than 2. In some embodiments, such as the one shown in FIG. 2, source channel structures 208 are disposed in four rows, and drain channel structures 210 are disposed in four rows as well.

Figure 3:
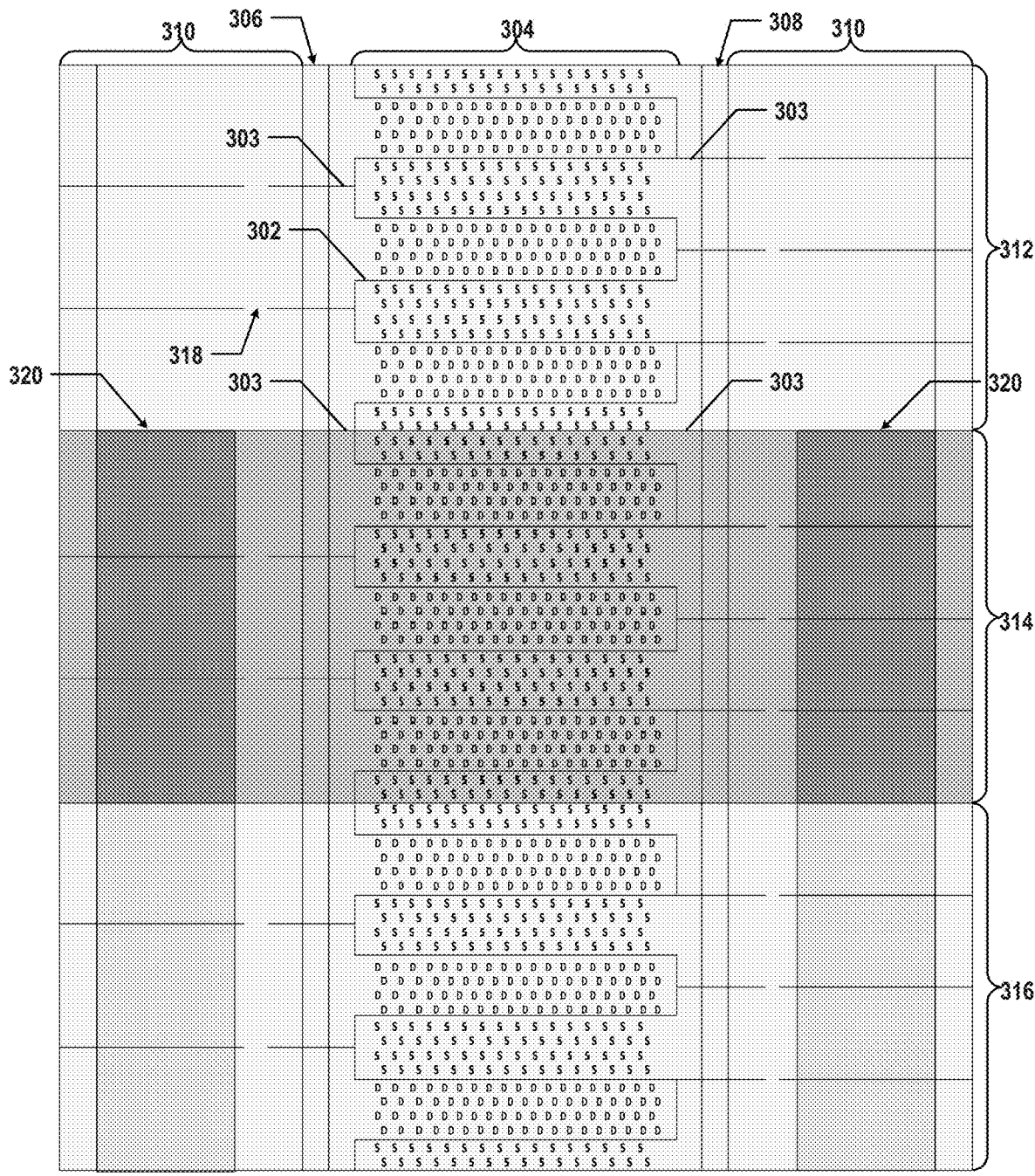
FIG. 3 illustrates a plan view of another exemplary 3D memory device, according to some embodiments of the present disclosure.

FIG. 3 illustrates a plan view of another exemplary 3D memory device 300, according to some embodiments of the present disclosure. Different from FIG. 2 in which only the components of 3D memory device 200 in the inner region of memory stack 206 are illustrated, FIG. 3 illustrates components in the outer region (e.g., staircase regions) of 3D memory device 300 as well. Similar to 3D memory device 200, 3D memory device 300 can include a slit structure 302 extending laterally along a serpentine path in the plan view the separate inner region 304 of the memory stack into two areas as well as an array of memory strings (represented as the S-D array) in inner region 304 of the memory stack. Outside of inner region 304, 3D memory device 300 can further include a plurality of drain select gates 306 configured to control the drains (D) of the array of memory strings and a plurality of source select gates 308 configured to control the sources (S) of the array of memory strings. In some embodiments, drain select gates 306 and source select gates 308 are separated by the array of memory strings in inner region 304 of the memory stack in the row direction (e.g., the x-direction in FIG. 3). That is, the serpentine pattern of slit structure 302 can achieve the separate controls of the sources and drains of the memory strings on two different sides of inner region 304 (and slit structure 302) in the x-direction. Drain select gates 306 can be arranged in the same section or divided into multiple sections (e.g., two sections as shown in FIG. 3). Each section of drain select gates 306 can have a boundary with a different distance to inner region 304 in the row direction (e.g., the x-direction in FIG. 3). Similarly, source select gates 308 can be arranged in the same section or divided into multiple sections (e.g., two sections as shown in FIG. 3). Each section of source select gates 308 can have a boundary with a different distance to inner region 304 in the row direction (e.g., the x-direction in FIG. 3).

As shown in FIG. 3, in some embodiments, 3D memory device 300 can further include a plurality of sub-slit structures 303 each connected to slit structure 302. In some embodiments, each sub-slit structure 303 extends laterally in the row direction (e.g., the x-direction in FIG. 3) from inner region 304 into outer regions 310 of the memory stack in the plan view. Sub-slit structures 303 can be disposed on different sides of inner region 304 of the memory stack in the row direction (e.g., the x-direction in FIG. 3). For example, one half of sub-slit structures 303 are disposed on one side of the memory stack, and the other half of sub-slit structures 303 are disposed on the other side of the memory stack. Sub-slit structures 303 can separate the memory stack into multiple regions (e.g., memory blocks or fingers) in the column direction (e.g., the y-direction in FIG. 3). In some embodiments, some continuous sub-slit structures 303 can separate the memory stack into multiple blocks in the y-direction including Block-0 312, Block-1 314, and Block-2 316. In each memory block, "H" cuts 318 can be formed in some slit structures 302, which laterally separates each memory block into multiple memory fingers. In some embodiments, staircase dividing structures (SDSs) 320 of the memory stack are formed in outer regions 310 on different sides of inner region 304 in the x-direction, such that the source channel structures (S) and drain channel structures (D) can be separately controlled by corresponding word lines and staircase structure 320 on opposite sides of inner region 304 (and slit structure 302) in the x-direction. In SDS 320, each stair (level) of the staircase structure can have multiple divisions for fan-out multiple word lines using the same stair, thereby reducing the interconnect layout complexity and increasing the utilization of the staircase structure.

Figure 4:
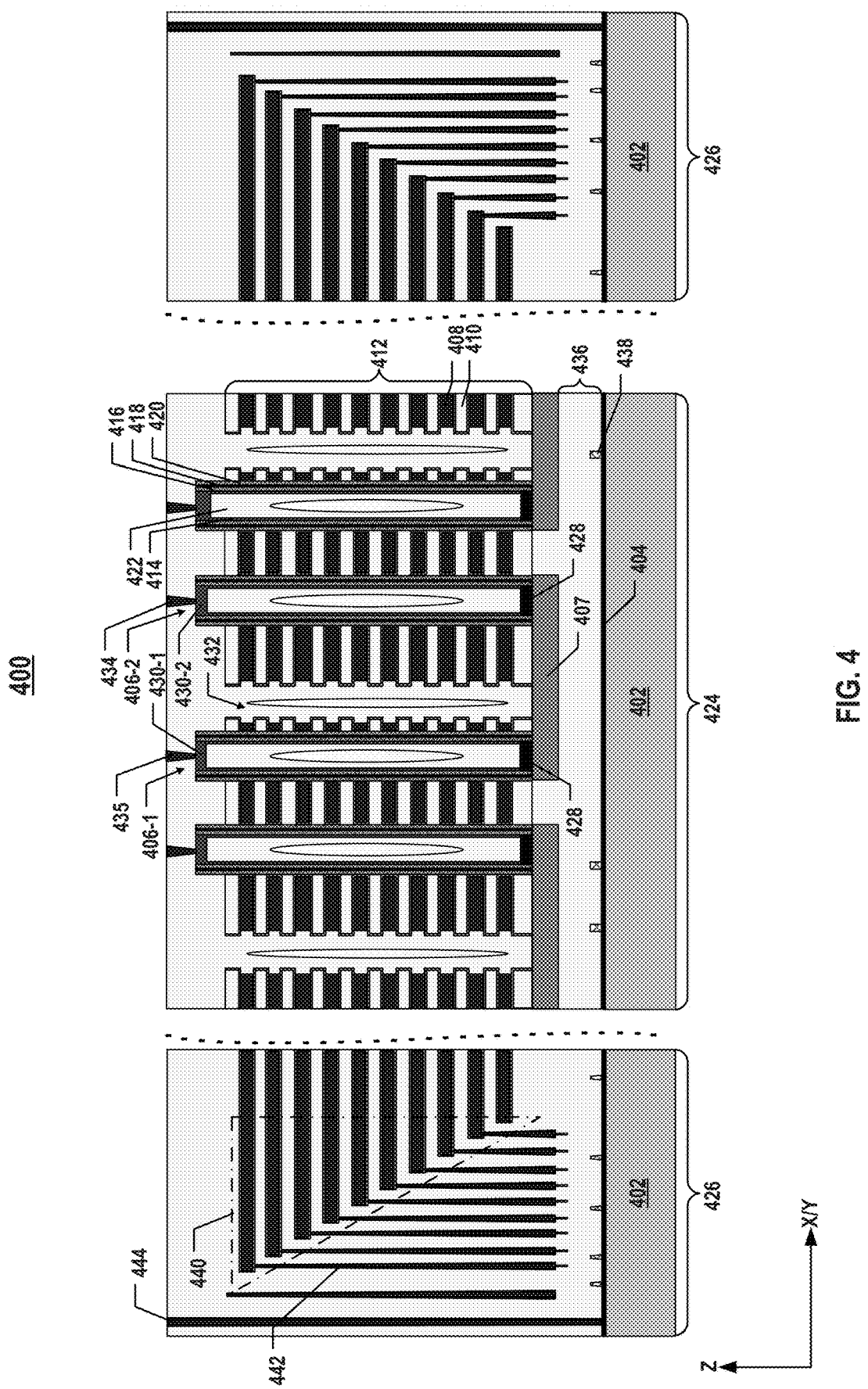
FIG. 4 illustrates a cross-section of an exemplary 3D memory device, according to some embodiments of the present disclosure.

FIG. 4 illustrates a cross-section of an exemplary 3D memory device 400, according to some embodiments of the present disclosure. 3D memory device 400 can include a substrate 402, which can include silicon (e.g., single crystalline silicon), silicon germanium (SiGe), gallium arsenide (GaAs), germanium (Ge), silicon on insulator (SOI), germanium on insulator (GOI), or any other suitable materials. 3D memory device 400 can include memory array devices above substrate 402. It is noted that x/y and z axes are included in FIG. 4 to further illustrate the spatial relationship of the components in 3D memory device 400. Substrate 402 includes two lateral surfaces extending laterally in the x-y plane: a top surface on the front side of the wafer, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., 3D memory device 400) is determined relative to the substrate of the semiconductor device (e.g., substrate 402) in the z-direction (the vertical direction perpendicular to the x-y plane) when the substrate is positioned in the lowest plane of the semiconductor device in the z-direction. The same notion for describing spatial relationship is applied throughout the present disclosure.

3D memory device 400 can be part of a non-monolithic 3D memory device, in which components (e.g., the peripheral device and memory array device) can be formed separately on different substrates and then joined, for example, bonded in a face-to-face manner. In some embodiments, the peripheral device substrate (e.g., substrate 402) remains as the substrate of the bonded non-monolithic 3D memory device, so that in the bonded non-monolithic 3D memory device, the memory array devices are above the peripheral device. Substrate 402 can be bonded to the remaining portion of 3D memory device 400 through a bonding interface 404 above substrate 402. In some embodiments, bonding interface 404 is the place at which substrate 402 and the remaining portion of 3D memory device 400 are met and bonded. In practice, bonding interface 404 can be a layer with a certain thickness that includes the top surface of substrate 402 and the bottom surface of the remaining portion of 3D memory device 400. In some embodiments, substrate 402 is a peripheral device chip, and one or more peripheral devices are formed on substrate 402. The peripheral devices can include any suitable digital, analog, and/or mixed-signal peripheral circuits used for facilitating the operation of 3D memory device 400, such as page buffers, decoders, and latches (not shown). In some embodiments, substrate 402 is a carrier wafer that does not include any semiconductor device formed thereon.

In some embodiments, 3D memory device 400 is a NAND Flash memory device in which memory cells are provided in the form of an array of U-shaped NAND memory strings in the side view. Each memory string can include a source channel structure 406-1 and a drain channel structure 406-2 connected by a semiconductor connection 407 at the respective lower end. Each of source and drain channel structures 406-1 and 406-2 can extend through a plurality of pairs each including a conductor layer 408 and a dielectric layer 410 (referred to herein as "conductor/dielectric layer pairs"). The stacked conductor/dielectric layer pairs are also referred to herein as a memory stack 412. The number of the conductor/dielectric layer pairs in memory stack 412 (e.g., 32, 64, 96, or 128) determines the number of memory cells in 3D memory device 400. Memory stack 412 can include interleaved conductor layers 408 and dielectric layers 410. Conductor layers 408 and dielectric layers 410 in memory stack 412 can alternate in the vertical direction. Conductor layers 408 can include conductive materials including, but not limited to, tungsten (W), cobalt (Co), copper (Cu), aluminum (Al), polysilicon, doped silicon, silicides, or any combination thereof. Dielectric layers 410 can include dielectric materials including, but not limited to, silicon oxide, silicon nitride, silicon oxynitride, or any combination thereof. In some embodiments, each conductor layer 408 of memory stack 412 includes a metal, such as tungsten.

As shown in FIG. 4, memory stack 412 can include an inner region 424 (also known as a "core array region") and an outer region 426 (also known as a "staircase region"). In some embodiments, inner region 424 is the center region of memory stack 412 where the array of NAND memory strings is formed through the conductor/dielectric layer pairs, and outer region 426 is the remaining region of memory stack 412 surrounding inner region 424 (including the sides and edges) without the NAND memory strings.

As shown in FIG. 4, each U-shaped NAND memory string can include source and drain channel structures 406-1 and 406-2 (collectively referred to herein as "channel structures" 406) each extending vertically through inner region 424 of memory stack 412. Channel structure 406 can include a channel hole filled with semiconductor materials (e.g., as a semiconductor channel 414) and dielectric materials (e.g., as a memory film). In some embodiments, semiconductor channel 414 includes silicon, such as amorphous silicon, polysilicon, or single crystalline silicon. In some embodiments, the memory film is a composite layer including a tunneling layer 416, a storage layer 418 (also known as a "charge trap layer"), and a blocking layer 420. The remaining space of the channel hole of channel structure 406 can be partially or fully filled with a capping layer 422 including dielectric materials, such as silicon oxide. Channel structure 406 can have a cylinder shape (e.g., a pillar shape). Capping layer 422, semiconductor channel 414, tunneling layer 416, storage layer 418, and blocking layer 420 are arranged radially from the center toward the outer surface of the pillar in this order, according to some embodiments. Tunneling layer 416 can include silicon oxide, silicon oxynitride, or any combination thereof. Storage layer 418 can include silicon nitride, silicon oxynitride, silicon, or any combination thereof. Blocking layer 420 can include silicon oxide, silicon oxynitride, high dielectric constant (high-k) dielectrics, or any combination thereof. In one example, the memory film can include a composite layer of silicon oxide/silicon oxynitride (or silicon nitride)/silicon oxide (ONO).

In some embodiments, conductor layer 408 in memory stack 412 functions as a gate conductor/gate line of memory cells in the NAND memory string. Conductor layer 408 can include multiple control gates of multiple NAND memory cells and can extend laterally as a word line ending at the edge of memory stack 412 (e.g., in a staircase structure of memory stack 412). In some embodiments, the word lines extend in the x-direction (shown in FIG. 2) perpendicular to both the y-direction and z-direction. In some embodiments, memory cell transistors in the NAND memory string include channel structure 406, gate conductors (e.g., parts of conductor layers 408 that abut channel structures 406) made from tungsten, adhesion layers (not shown) including titanium/titanium nitride (Ti/TiN) or tantalum/tantalum nitride (Ta/TaN), and gate dielectric layers made from high-k dielectric materials.

In some embodiments, each channel structure 406 includes a lower semiconductor plug 428 at its lower end in contact with semiconductor connection 407. In some embodiments, each lower semiconductor plug 428 is in contact with the lower end of respective semiconductor channel 414. As used herein, the "upper end" of a component (e.g., channel structure 406) is the end farther away from substrate 402 in the z-direction, and the "lower end" of the component (e.g., channel structure 406) is the end closer to substrate 402 in the z-direction when substrate 402 is positioned in the lowest plane of 3D memory device 400. Lower semiconductor plug 428 can include a semiconductor material, such as polysilicon.

In some embodiments, each channel structure 406 further includes an upper semiconductor plug 430-1 or 430-2 at its upper end. For each source channel structure 406-1, respective upper semiconductor plug 430-1 can work as the source of the corresponding U-shaped NAND memory string. For each drain channel structure 406-2, respective upper semiconductor plug 430-2 can work as the drain of the corresponding U-shaped NAND memory string. That is, each source channel structure 406-1 can include a source at its upper end, and each drain channel structure 406-2 can include a drain at its upper end. Different from some 3D NAND memory devices in which sources and drains are formed at opposite ends of channel structures, the sources and drains in 3D memory device 400 are formed on the same ends (i.e., upper ends) of channel structures 406. In some embodiments, each upper semiconductor plug 430-1 or 430-2 is in contact with the upper end of respective semiconductor channel 414. Upper semiconductor plug 430-1 or 430-2 can include a semiconductor material, such as polysilicon.

In some embodiments, 3D memory device 400 further includes a slit structure 432 extending vertically through memory stack 412. Slit structure 432 thus can separate conductor layers (gate lines/word lines) 408 surrounding a pair of source channel structure 406-1 and drain channel structure 406-2 that form a U-shaped NAND memory string. Slit structure 432, however, does not extend vertically through semiconductor connection 407 and thus, does not break the electrical connection between a pair of source channel structure 406-1 and drain channel structure 406-2 that form a U-shaped NAND memory string, according to some embodiments. The side view of inner region 424 may correspond to a cross-section view along the y-direction in FIGS. 2 and 3.

In some embodiments, slit structure 432 includes a slit opening (e.g., a trench) fully or partially filled with a dielectric, such as silicon oxide, to electrically separate surrounding conductor layers 408 in memory stack 412. As a result, slit structures 432 can laterally separate 3D memory device 400 into multiple memory regions, such as memory blocks. Different from GLS 104 of 3D memory device 100 in FIG. 1, which is filled with conductive materials to make GLS 104 function as the ACS contact, the slit opening of slit structure 432 in FIG. 4 is not filled with any conductive materials as slit structure 432 does not function as the source contact, according to some embodiments.

In some embodiments, 3D memory device 400 further includes local interconnects, such as source line contacts 435 and bit line contacts 434 formed in one or more interlayer dielectric (ILD) layers (also known as "intermetal dielectric (IMD) layers") above memory stack 412. Each source line contact 435 can be above and in contact with upper semiconductor plug 430-1 of source channel structure 406-1, which acts as the source of the respective NAND memory string. Each bit line contact 434 can be above and in contact with upper semiconductor plug 430-2 of drain channel structure 406-2, which acts as the drain of the respective NAND memory string. In some embodiments, the upper ends of bit line contacts 434 are in contact with bit lines (not shown), and the upper ends of source line contacts 435 are in contact with source lines (not shown). The bit lines and source lines can be formed in one or more ILD layers.

In some embodiments, 3D memory device 400 further includes an interconnect layer 436 disposed vertically between semiconductor connections 407 and bonding interface 404. Interconnect layer 436 can include interconnects 438 formed in one or more ILD layers for transferring electrical signals between the U-shaped NAND memory strings and the peripheral devices on substrate 402. Interconnects 438 and the ILD layers can be collectively referred to herein as an "interconnect layer" 436. Bit line contacts 434, source line contacts 435, the bit lines, the source lines, and interconnects 438 in interconnect layer 436 can include conductive materials including, but not limited to, W, Co, Cu, Al, polysilicon, doped silicon, silicides, or any combination thereof. The ILD layers can include dielectric materials including, but not limited to, silicon oxide, silicon nitride, silicon oxynitride, or any combination thereof.

In some embodiments, 3D memory device 400 further includes a plurality of semiconductor connections 407 above interconnect layer 436 and bonding interface 404. Semiconductor connections 407 are disposed below memory stack 412 and channel structures 406 formed herein, according to some embodiments. In some embodiments in which substrate 402 is a peripheral device chip, a peripheral device is disposed vertically between substrate 402 and semiconductor connections 407. In some embodiments, each semiconductor connection 407 is in contact with two lower semiconductor plugs of a pair of source channel structure 406-1 and drain channel structure 406-2 that form a U-shaped NAND memory string.

As shown in FIG. 4, on at least two sides in the lateral direction, outer region 426 of memory stack 412 can include multiple staircase structures 440. In each staircase structure 440, the edges of interleaved conductor layers 408 and dielectric layers 410 along the vertical direction toward substrate 402 (the negative z-direction) can be staggered laterally toward channel structures 406 in inner region 424 of memory stack 412. In other words, the edges of memory stack 412 in staircase structures 440 of memory stack 412 can be tilted toward inner region 424 as moving toward substrate 402 (from top to bottom). In some embodiments, the length of conductor layer 408 of memory stack 412 decreases from the top to the bottom. The side view of outer region 426 may correspond to a cross-section view along the x-direction in FIGS. 2 and 3.

In some embodiments, 3D memory device 400 further includes a plurality of word line contacts 442 each in contact with respective conductor layer (word line) 408 for word line fan-out. In some embodiments, one half of word line contacts 442 are used with one staircase structure 440 for word line fan-out of source channel structures 406-1, and another half of word line contacts 442 are used with another staircase structure 440 for word line fan-out of drain channel structures 406-2. That is, source channel structures 406-1 and drain channel structure 406-2 can be controlled by word lines from different sides of memory stack 412 in the lateral direction. In some embodiments, 3D memory device 400 further includes peripheral contacts 444 that can pad-out the peripheral devices on substrate 402 directly.

FIGS. 5A-5L illustrate an exemplary fabrication process for forming a 3D memory device, according to some embodiments of the present disclosure. FIG. 6 illustrates a flowchart of an exemplary method 600 for forming a 3D memory device, according to some embodiments of the present disclosure. Examples of the 3D memory device depicted in FIGS. 5A-5L and 6 include 3D memory devices 200, 300, and 400 depicted in FIGS. 2-4. FIGS. 5A-5L and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a first channel structure and a second channel structure each extending vertically through a memory stack including interleaved conductor layers and dielectric layers above a first substrate are formed. In some embodiments, to form the first and second channel structures, a dielectric stack is formed above the first substrate. The substrate can be a silicon substrate. The dielectric stack can include interleaved sacrificial layers and dielectric layers. In some embodiments, to form the first and second channel structures, a first channel hole and a second channel hole each extending vertically through the dielectric stack are etched. In some embodiments, to form the first and second channel structures, a memory film and a semiconductor channel are subsequently deposited over sidewalls and bottom surfaces of the first and second channel holes.

Figure 5A:
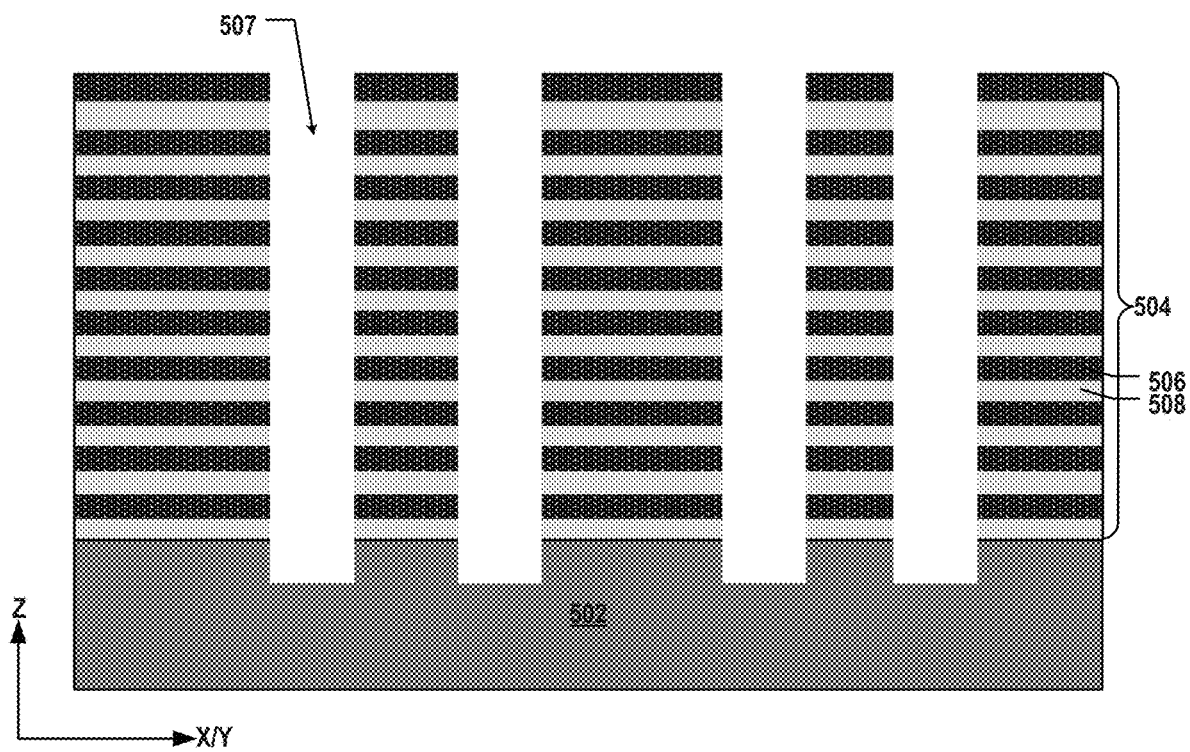
FIGS. 5A-5L illustrate an exemplary fabrication process for forming a 3D memory device, according to some embodiments of the present disclosure.
Figure 6:
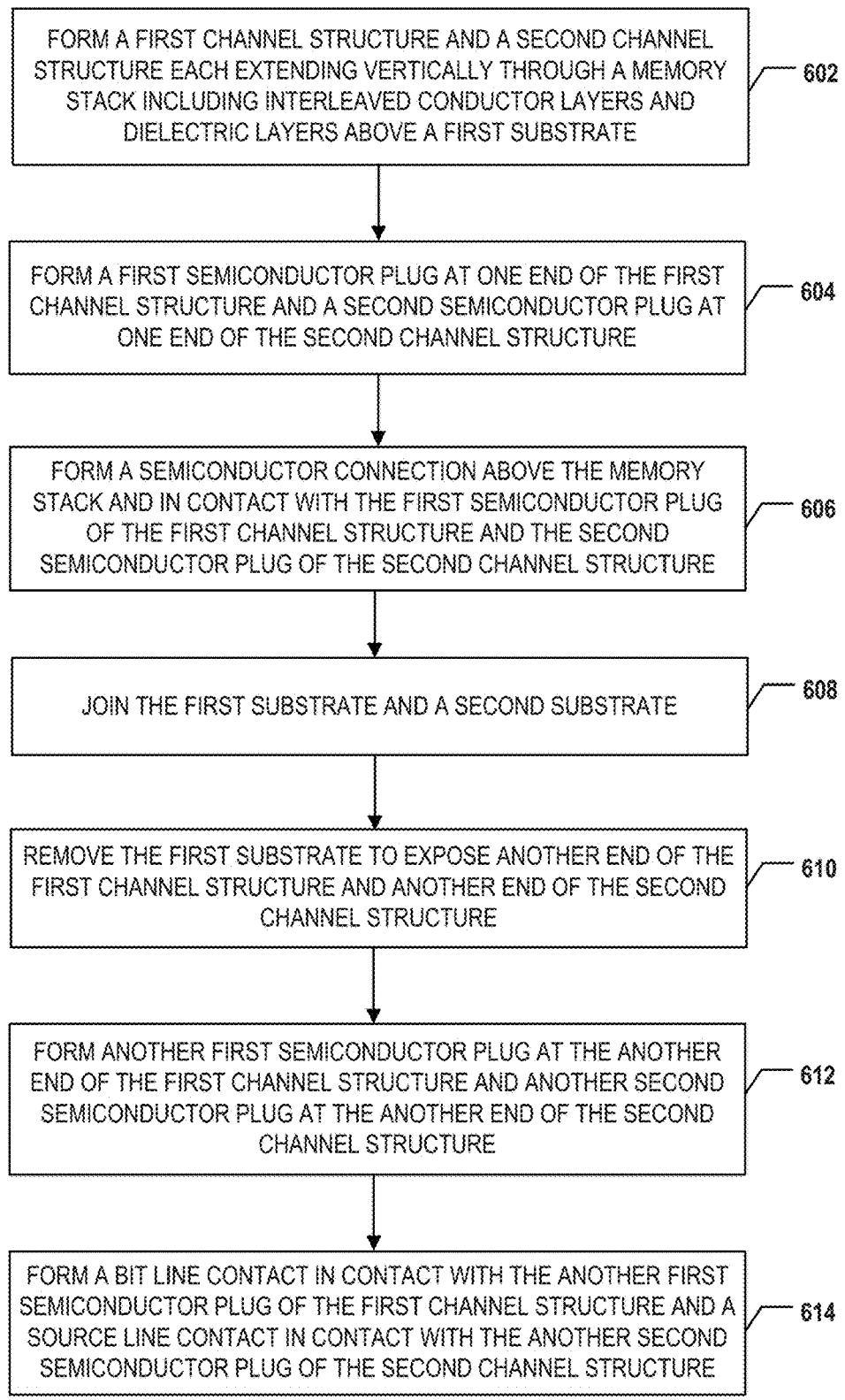
FIG. 6 illustrates a flowchart of an exemplary method for forming a 3D memory device, according to some embodiments of the present disclosure.

Referring to FIG. 5A, a dielectric stack 504 including interleaved first dielectric layers (also known as "sacrificial layers" 506) and second dielectric layers 508 (together referred to herein as "dielectric layer pairs") is formed above a silicon substrate 502. Dielectric layers 508 and sacrificial layers 506 can be alternatingly deposited on silicon substrate 502 to form dielectric stack 504. In some embodiments, each dielectric layer 508 includes a layer of silicon oxide, and each sacrificial layer 506 includes a layer of silicon nitride. Dielectric stack 504 can be formed by one or more thin film deposition processes including, but not limited to, chemical vapor deposition (CVD), physical vapor deposition (PVD), atomic layer deposition (ALD), or any combination thereof. In some embodiments, an insulation layer (not shown) is formed between silicon substrate 502 and dielectric stack 504 by depositing dielectric materials, such as silicon oxide, on silicon substrate 502.

As illustrated in FIG. 5A, a plurality of channel holes 507 (including a source channel hole and a drain channel hole) are simultaneously formed through dielectric stack 504. In some embodiments, an etching mask (not shown) is patterned on dielectric stack 504 by photolithography, development, and etching. The etching mask can be a photoresist mask or a hard mask patterned based on a photolithography mask. Dielectric stack 504 can be etched through by one or more wet etching and/or dry etching processes, such as deep reactive-ion etching (DRIE), using the patterned etching mask to simultaneously form channel holes in a pattern defined by the photolithography mask and etching mask. In some embodiments, channel hole 507 extends vertically further into the upper portion of silicon substrate 502. The etching process through dielectric stack 504 may not stop at the top surface of silicon substrate 502 and may continue to etch part of silicon substrate 502.

Figure 5B:
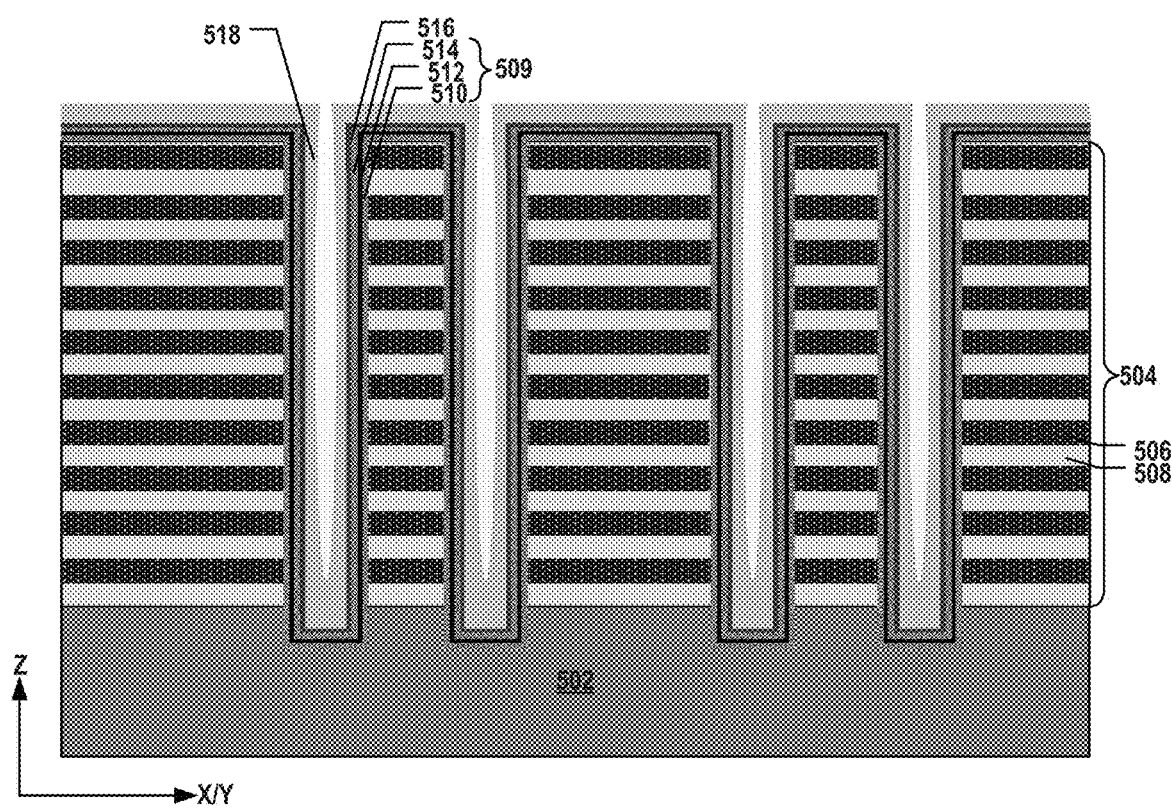

As illustrated in FIG. 5B, a memory film 509 (e.g., including a blocking layer 510, a storage layer 512, and a tunneling layer 514) and a semiconductor channel 516 are subsequently deposited over sidewalls and bottom surfaces of channel holes 507 (including the source and drain channel holes). In some embodiments, memory film 509 is first deposited along the sidewall and bottom surface of channel hole 507, and semiconductor channel 516 is then deposited over memory film 509. Blocking layer 510, storage layer 512, and tunneling layer 514 can be subsequently deposited in this order using one or more thin film deposition processes, such as ALD, CVD, PVD, any other suitable processes, or any combination thereof, to form memory film 509. Semiconductor channel 516 can then be deposited on tunneling layer 514 using one or more thin film deposition processes, such as ALD, CVD, PVD, any other suitable processes, or any combination thereof. In some embodiments, a capping layer 518 is fully or partially filled in the remaining space of channel hole 507 by depositing dielectric materials after the deposition of semiconductor channel 516, such as silicon oxide.

Figure 5C:
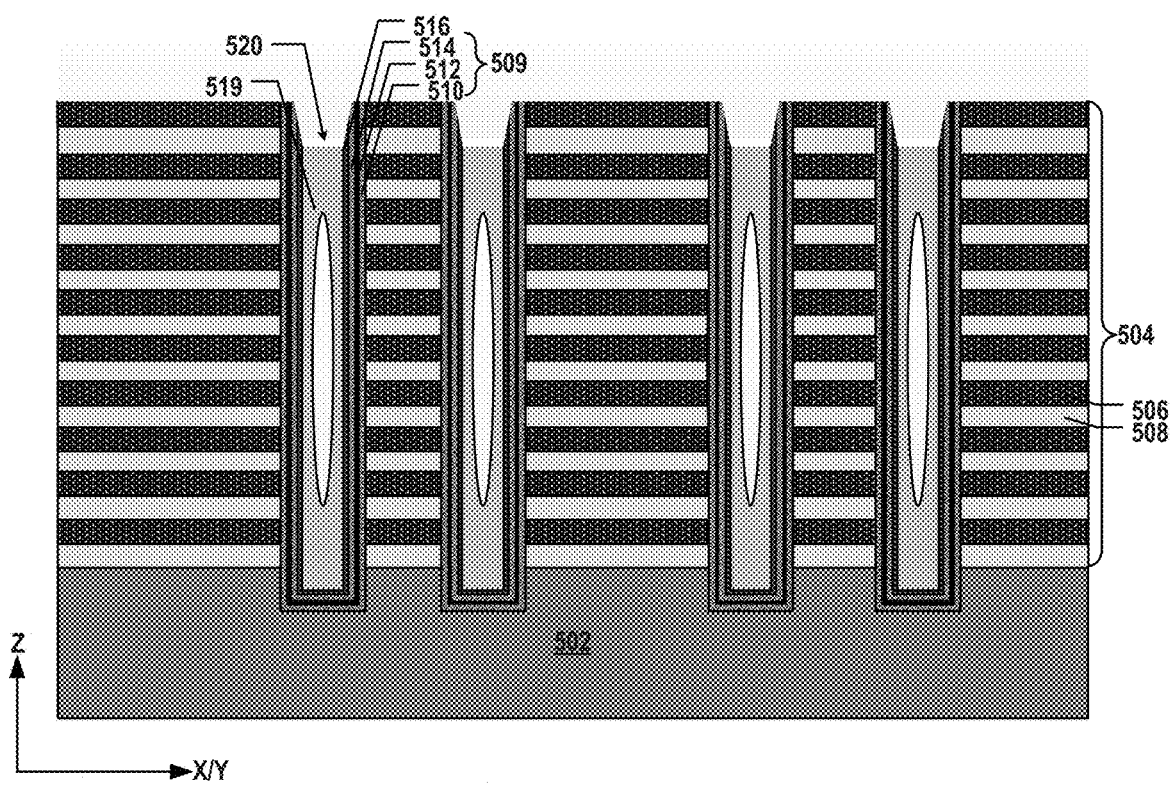
Figure 5D:
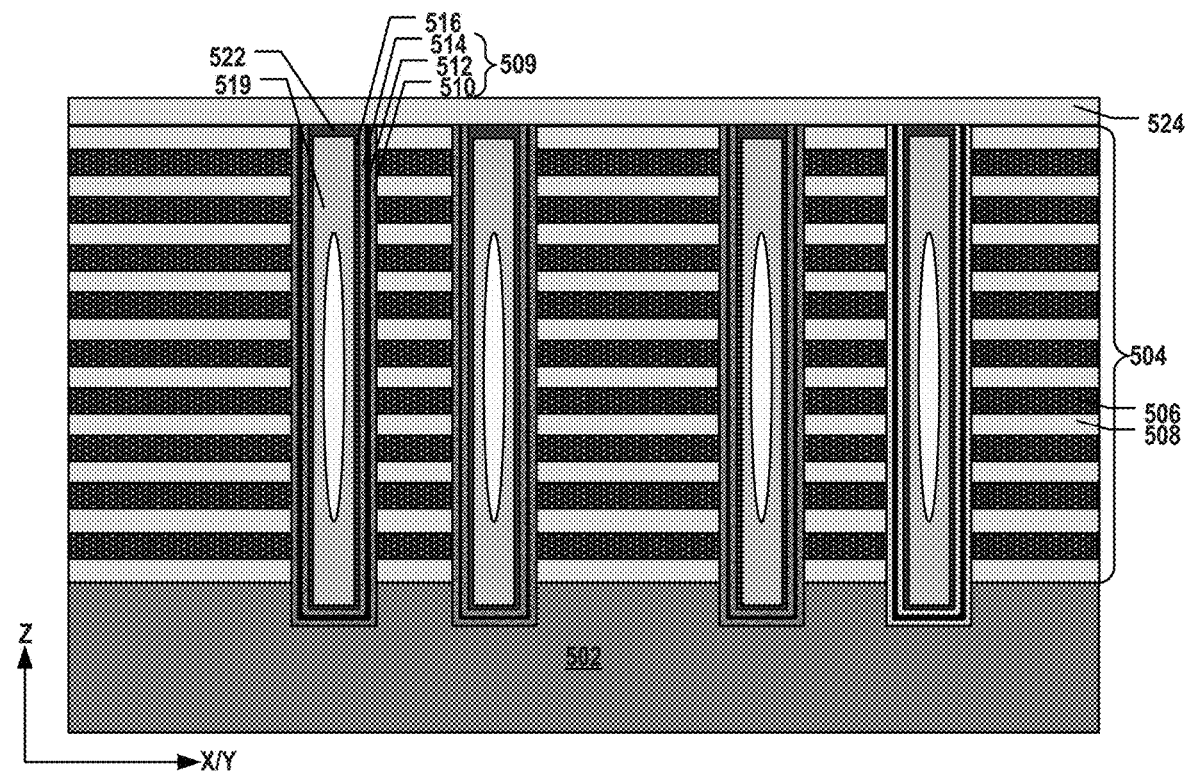

Method 600 proceeds to operation 604, as illustrated in FIG. 6, in which a first semiconductor plug is formed at one end of the first channel structure, and a second semiconductor plug is formed at one end of the second channel structure. As illustrated in FIG. 5C, another capping layer 519 is on top of capping layer 518 to seal channel hole 507 by depositing dielectrics, such as silicon oxide, using one or more thin film deposition processes, such as ALD, CVD, PVD, any other suitable processes, or any combination thereof, followed by a dielectric CMP process. In some embodiments, semiconductor plug recesses 520 are formed in the upper portion of each channel hole 507 (as shown in FIG. 5A). In some embodiments, parts of memory film 509, semiconductor channel 516, and capping layer 519 on the top surface of dielectric stack 504 and in the upper portion of channel hole 507 can be removed by CMP, grinding, wet etching, and/or dry etching to form semiconductor plug recess 520 in the upper portion of channel hole 507. As illustrated in FIG. 5D, semiconductor plugs 522 can then be formed by depositing semiconductor materials, such as polysilicon, into semiconductor plug recesses 520 by one or more thin film deposition processes, such as CVD, PVD, ALD, electroplating, electroless plating, or any combination thereof. In some embodiments, a polysilicon CMP process is performed to remove the excess polysilicon deposition and planarize the top surface of semiconductor plugs 522 and dielectric stack 504. In some embodiments, an insulation layer 524 is formed on dielectric stack 504 by depositing a dielectric, such as silicon oxide, using one or more thin film deposition processes, such as CVD, PVD, ALD, or any combination thereof, to cover semiconductor plugs 522 and dielectric stack 504.

In some embodiments, a slit opening extending vertically through the dielectric stack and laterally between the first channel structure and the second channel structure is formed, and the memory stack is formed by replacing, through the slit opening, the sacrificial layers with the conductor layers. In some embodiments, the slit opening is then filled with a dielectric.

Figure 5E:
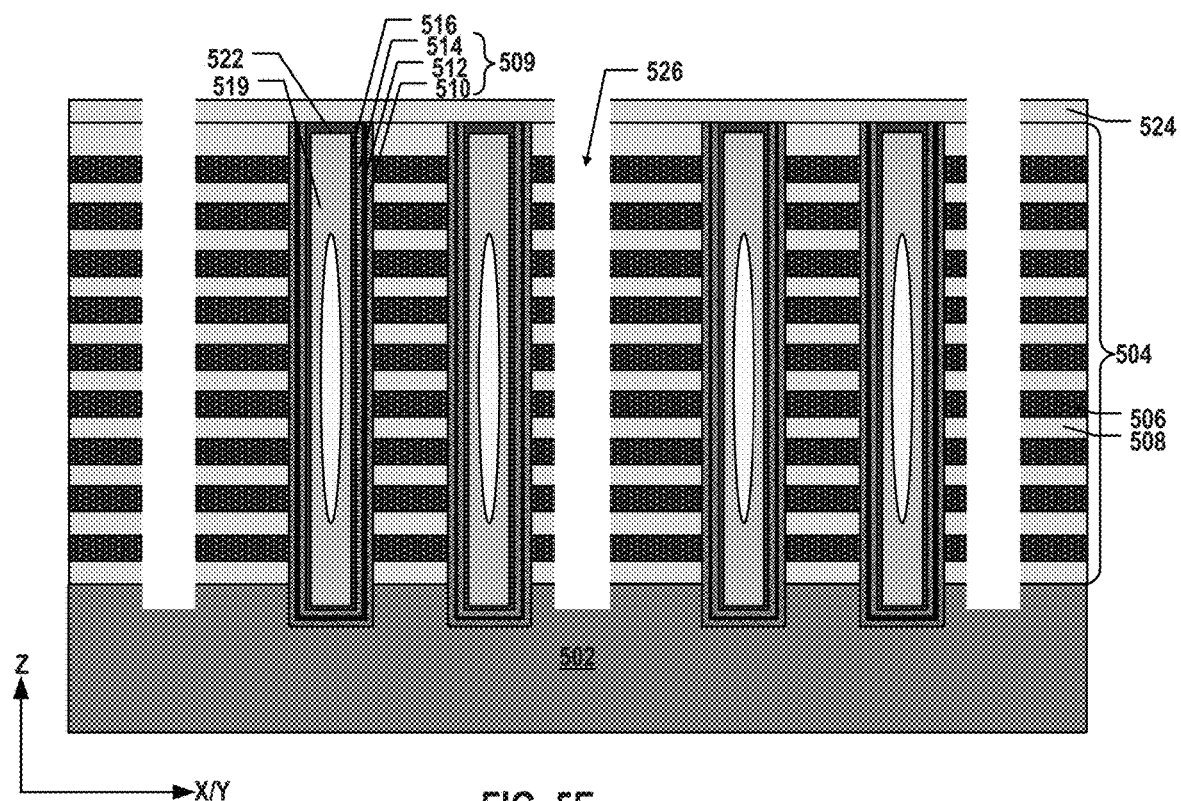

As illustrated in FIG. 5E, slit openings 526 extending vertically through dielectric stack 504 are formed by etching through interleaved sacrificial layers 506 and dielectric layers 508 using wet etching processes and/or dry etching processes, such as DRIE. In some embodiments, slit opening 526 extends vertically further into the upper portion of silicon substrate 502. The etching process through dielectric stack 504 may not stop at the top surface of silicon substrate 502 and may continue to etch part of silicon substrate 502.

Figure 5F:
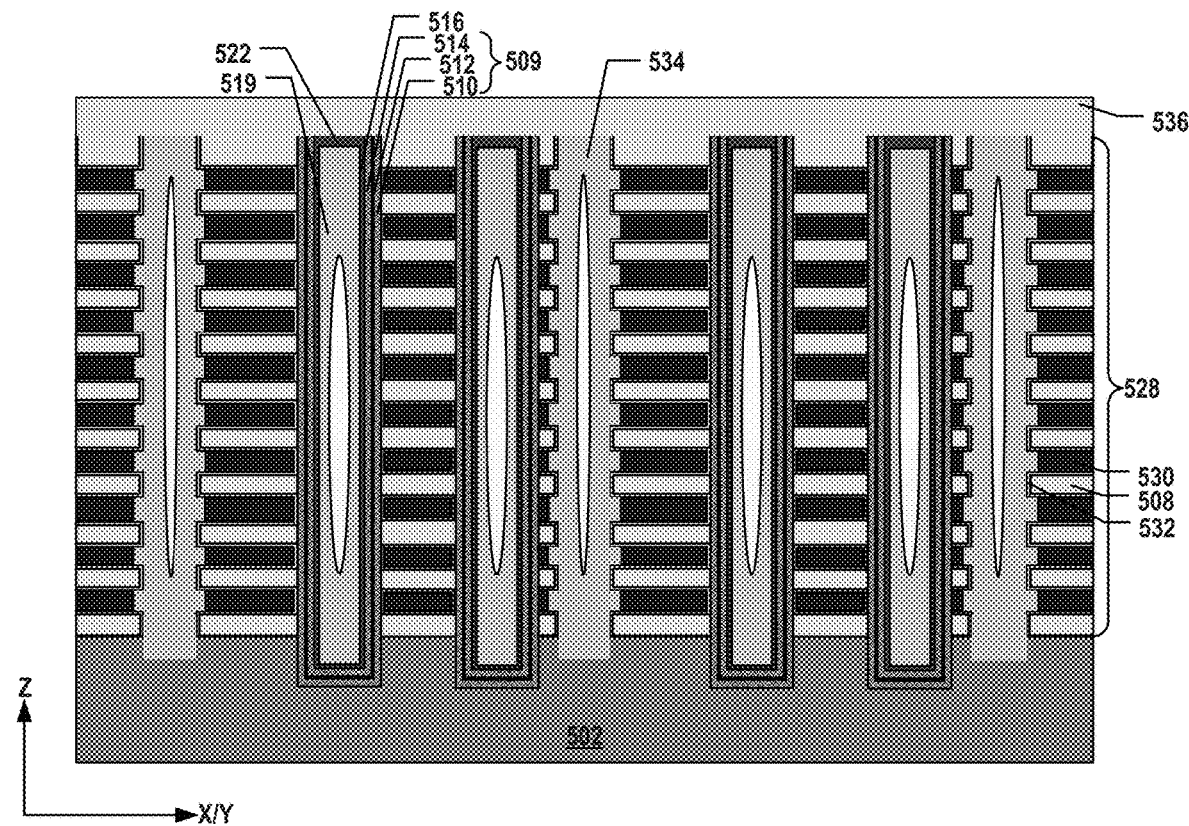

As illustrated in FIG. 5F, sacrificial layers 506 (shown in FIG. 5E) in dielectric stack 504 are removed by wet etching and/or dry etching selective to dielectric layers 508. Etchant for removing sacrificial layers 506 can be transported through silt openings 526. In some embodiments, the etching process is facilitated by exposing silt openings 526 to hot phosphoric acid by which silicon nitride in sacrificial layers 506 is etched preferentially over silicon oxide in dielectric layers 508.

As illustrated in FIG. 5F, conductor layers 530 are formed along the sidewalls of silt openings 526 and filling in the lateral recesses left by etched sacrificial layers 506. In some embodiments, conductor layers 530 is a composite layer including an adhesion layer and a conductor layer (e.g., a gate conductor/gate line). In some embodiments, a gate dielectric layer 532 is deposited prior to the deposition of conductor layers 530. Gate dielectric layer 532 and conductor layers 530 can be formed by one or more thin film deposition processes, such as ALD, CVD, PVD, any other suitable processes, or any combination thereof. Gate dielectric layer 532 can include dielectric materials including silicon nitride, high-k dielectrics, or any combination thereof. Conductor layer 530 can include conductive materials including, but not limited to, W, Co, Cu, Al, polysilicon, silicides, or any combination thereof. In some embodiments, gate dielectric layer 532 and conductor layer 530 are each formed by CVD processes in which the reaction gases pass through silt openings 526 to the lateral recesses and are reacted and deposited along the sidewalls of silt openings 526 and the lateral recesses. Conductor layers 530 thereby replace sacrificial layers 506 to transfer dielectric stack 504 into a memory stack 528.

As illustrated in FIG. 5F, conductor layer 530 formed along the sidewalls of silt openings 526 is removed, and the recesses abutting the sidewall of silt openings 526 are formed by removing parts of conductor layers 530 using an etch-back process. In some embodiments, the recesses are formed by applying etchants to conductor layers 530 through slit openings 526 to completely remove part of conductor layers 530 along the sidewall of slit openings 526 and further etch parts of conductor layers 530 in the lateral recesses. The dimension of the recess can be controlled by the etching rate (e.g., based on the etchant temperature and concentration) and/or etching time.

As illustrated in FIG. 5F, slit openings 526 (as shown in FIG. 5E) are fully or partially filled with a dielectric, such as silicon oxide, by one or more thin film deposition processes, such as ALD, CVD, PVD, any other suitable processes, or any combination thereof, to form slit structures 534. In some embodiments, no conductive material is filled into slit openings 526, and slit structure 534 does not include a conductor.

Method 600 proceeds to operation 606, as illustrated in FIG. 6, in which a semiconductor connection in contact with the first semiconductor plug of the first channel structure and the second semiconductor plug of the second channel structure is formed. In some embodiments, to form the semiconductor connection, a semiconductor connection dielectric layer is formed above the memory stack. In some embodiments, to form the semiconductor connection, the semiconductor connection is patterned in the semiconductor connection dielectric layer. In some embodiments, to form the semiconductor connection, an interconnect layer on the semiconductor connection dielectric layer.

Figure 5G:
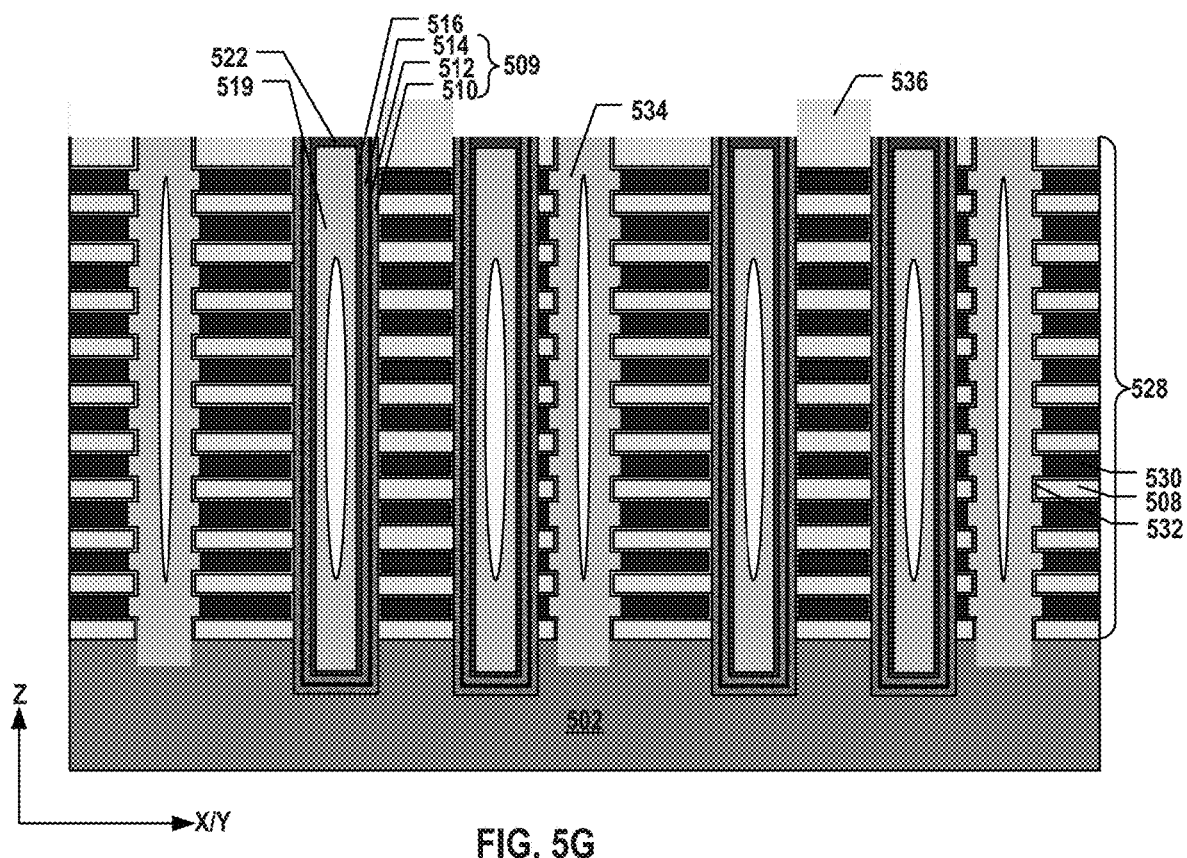
Figure 5H:
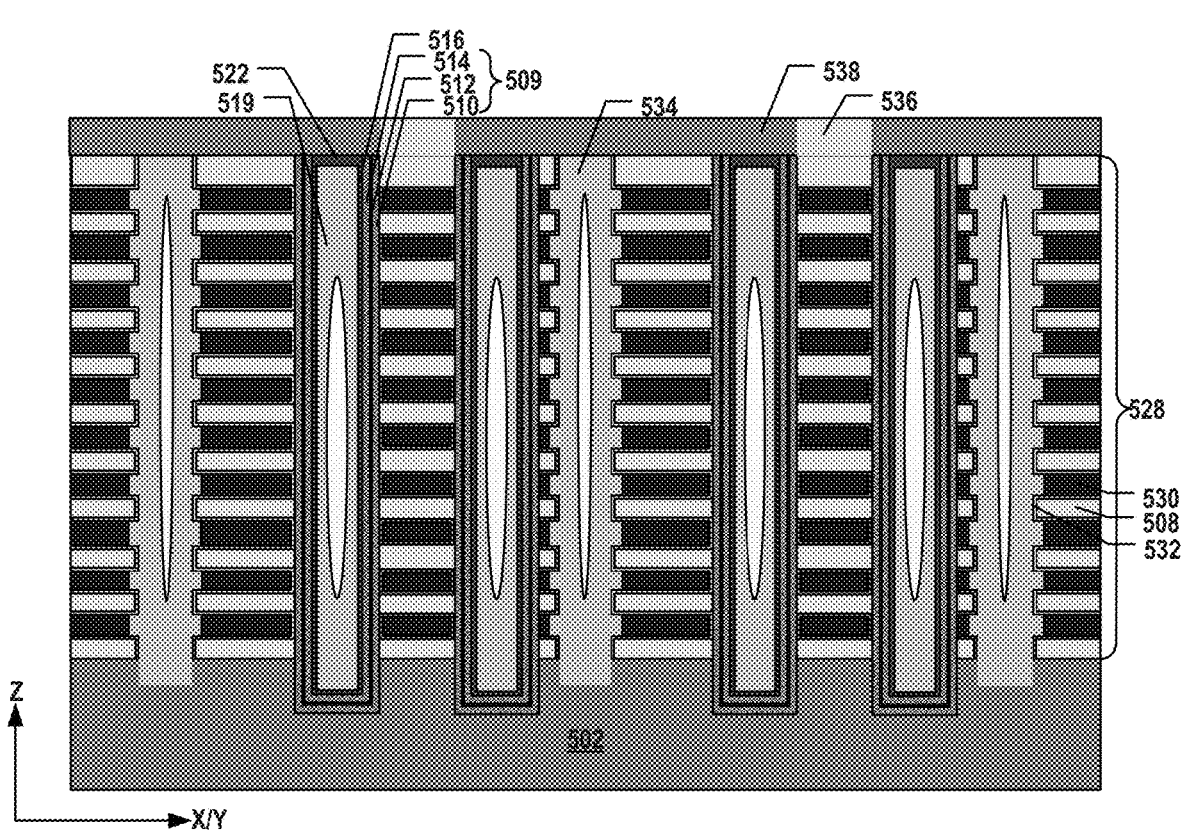

As illustrated in FIG. 5F, a semiconductor connection dielectric layer 536 is formed above memory stack 528 by depositing a dielectric, such as silicon oxide, using one or more thin film deposition processes, such as CVD, PVD, ALD, or any combination thereof. As illustrated in FIG. 5G, dielectrics in semiconductor connection dielectric layer 536 are patterned by photolithography and wet etching process and/or dry etching process. As illustrated in FIG. 5H, semiconductor connections 538 are patterned in semiconductor connection dielectric layer 536 by filling the openings between dielectrics with a semiconductor material, such as polysilicon, using one or more thin film deposition processes, such as CVD, PVD, ALD, electroplating, electroless plating, or any combination thereof. In some embodiments, a polysilicon CMP process is performed to remove the excess polysilicon deposition and planarize the top surface of semiconductor connections 538 and semiconductor connection dielectric layer 536. Each semiconductor connection 538 can be in contact with two semiconductor plugs 522 and thus, electrically connect semiconductor channels 516 formed in two channel holes 507.

Figure 5I:
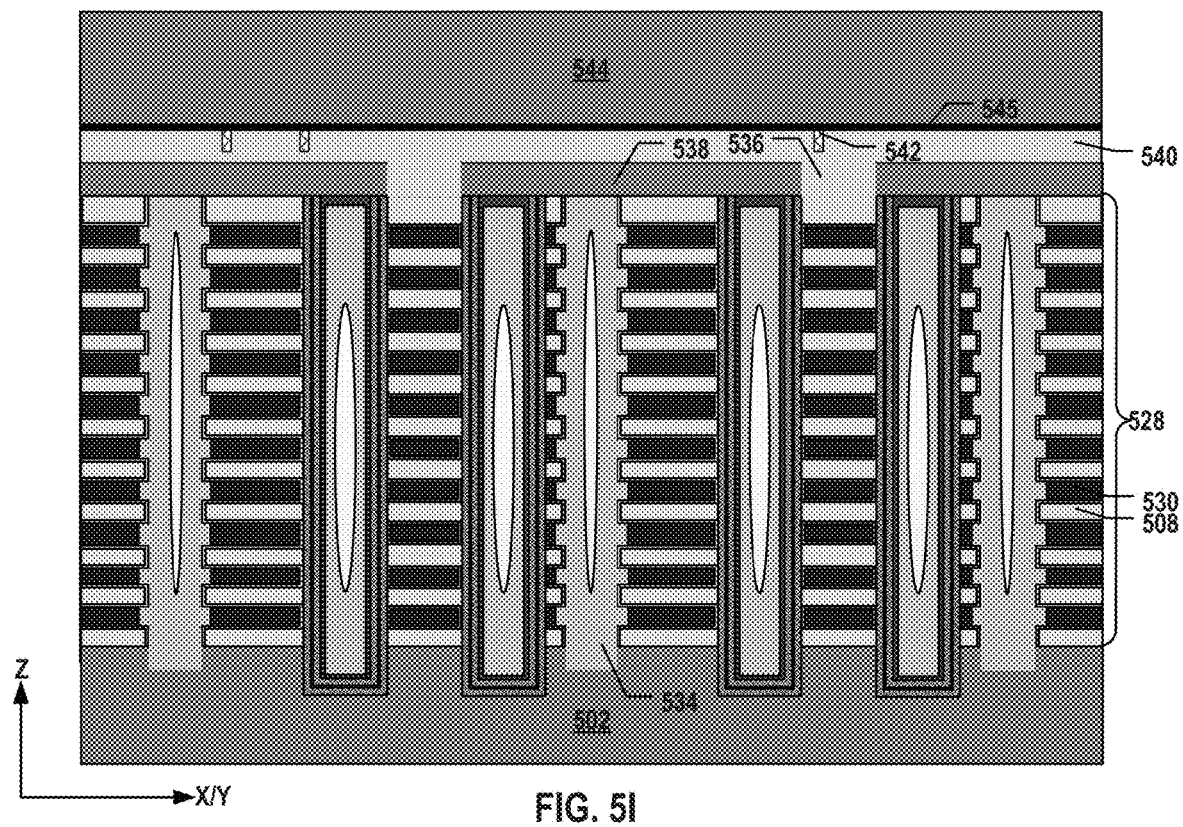

As illustrated in FIG. 5I, an interconnect layer 540 (e.g., a back-end-of-line (BEOL) interconnect layer) including multiple ILD layers and interconnects 542 therein is formed on the top surface of semiconductor connections 538 and semiconductor connection dielectric layer 536 in multiple processes. For example, interconnects 542 can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof.

Method 600 proceeds to operation 608, as illustrated in FIG. 6, in which the first substrate and a second substrate are joined. In some embodiments, the first substrate and the second substrate are bonded in a face-to-face manner. In some embodiments, the interconnect layer above the first substrate is bonded with a front side of the second substrate. In some embodiments, the second substrate is a carrier wafer.

In some embodiments, prior to joining the first substrate and the second substrate, a peripheral device is formed on the second substrate. The peripheral device can include a plurality of transistors (not shown) formed on a second substrate. The transistors can be formed by a plurality of processes including, but not limited to, photolithography, dry/wet etch, thin film deposition, thermal growth, implantation, CMP, and any other suitable processes.

As illustrated in FIG. 5I, a silicon substrate 544 (and the peripheral device formed thereon if any) is flipped upside down. The front side of silicon substrate 544 facing down is joined with interconnect layer 540 facing up, i.e., in a face-to-face manner to form a bonding interface 545 between silicon substrate 544 and interconnect layer 540. The joining processes can include bonding, adhesive joining, soldering, to name a few. In some embodiments in which a peripheral device is formed in silicon substrate 544, the bonding is performed using a hybrid bonding process. In some embodiments, a treatment process, e.g., a plasma treatment, a wet treatment, and/or a thermal treatment, is applied to the bonding surfaces prior to the hybrid bonding. In some embodiments in which silicon substrate 544 is a carrier wafer, the bonding is performed using a silicon-dielectric bonding process.

Method 600 proceeds to operation 610, as illustrated in FIG. 6, in which the first substrate is removed to expose another end of the first channel structure and another end of the second channel structure. In some embodiments, to remove the first substrate, the bonded first and second substrates are flipped, such that the second substrate is below the first substrate. In some embodiments, to remove the first substrate, the first substrate is thinned. In some embodiments, to remove the first substrate, the first substrate and upper portions of the first and second channel structures are planarized.

Figure 5J:
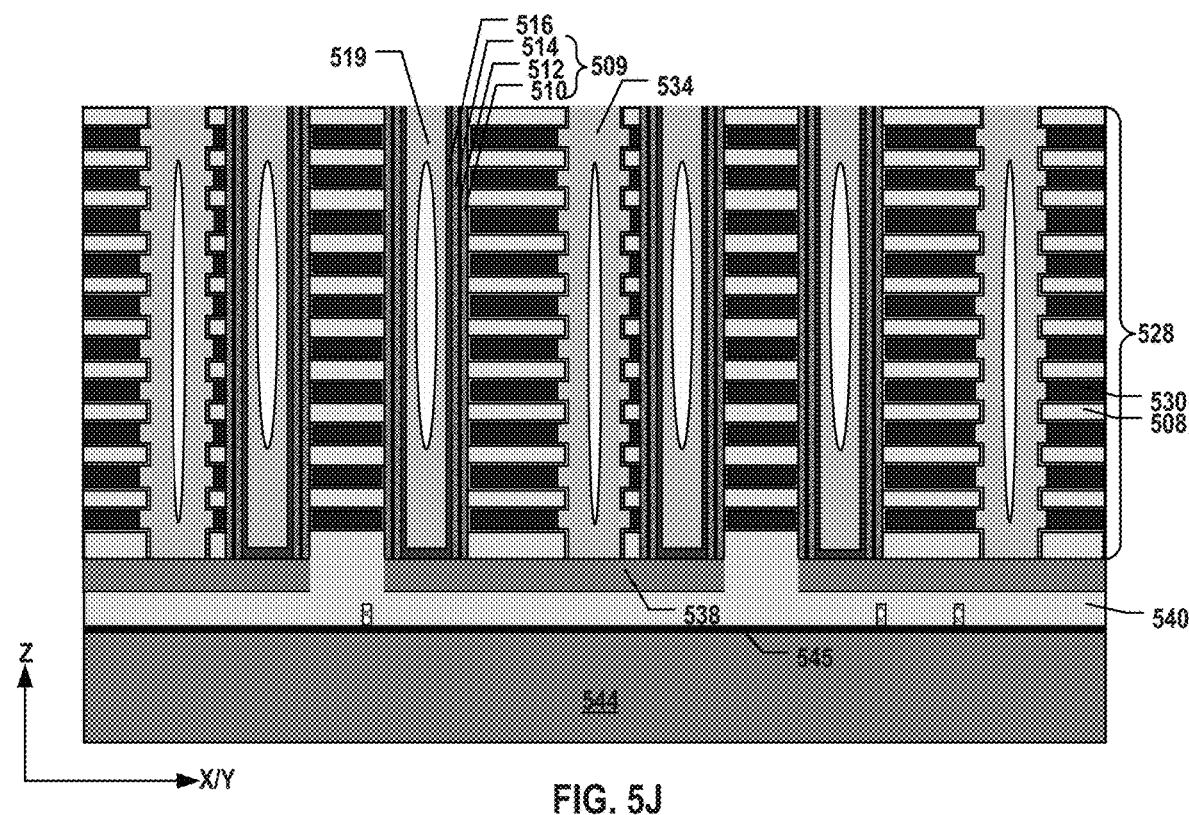

As illustrated in FIG. 5J, bonded silicon substrate 502 (not shown) and silicon substrate 544 are flipped upside down such that silicon substrate 544 is at the bottom of the bonded device. Silicon substrate 502 is removed, according to some embodiments.

Silicon substrate 502 can be removed by first thinning silicon substrate 502 using grinding process, followed by one or more wet etching processes and CMP process to fully remove silicon substrate 502 and the upper portion of memory film 509 and semiconductor channel 516 over the top surface of channel holes. As a result, capping layer 519 in each channel hole can be exposed.

Figure 5K:
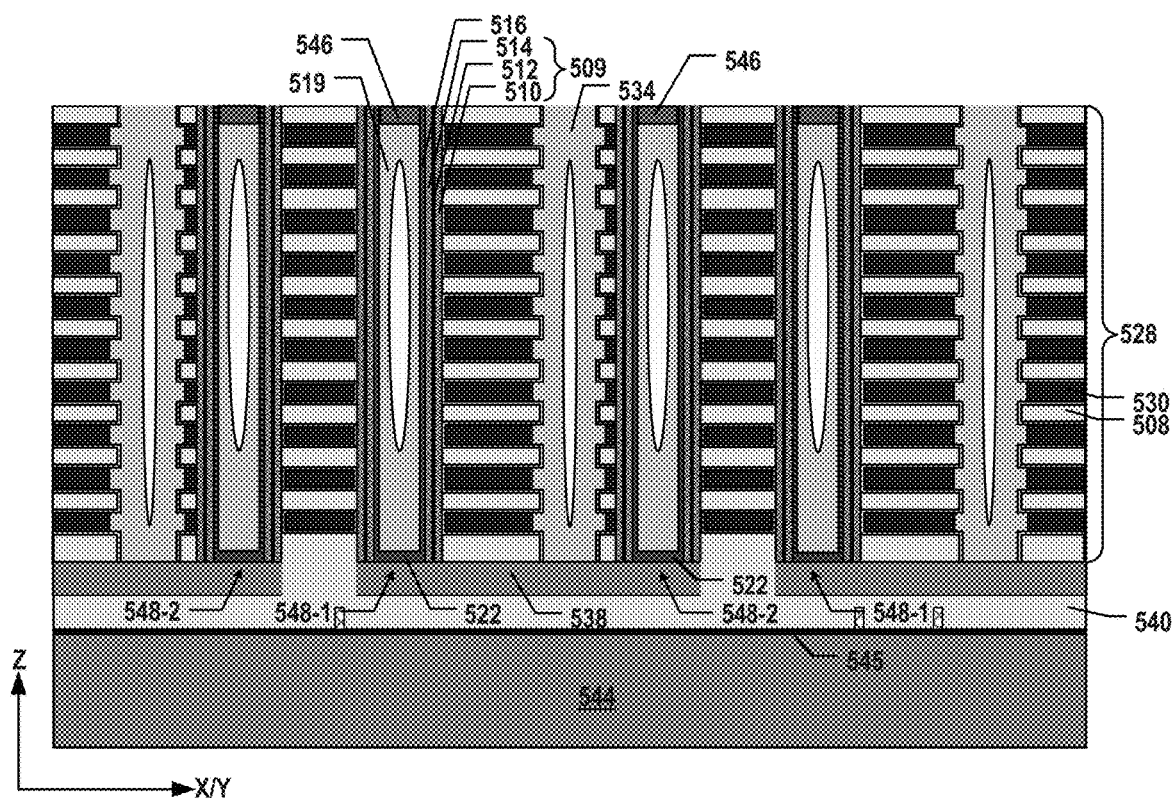

Method 600 proceeds to operation 612, as illustrated in FIG. 6, in which another first semiconductor plug is formed at the other end of the first channel structure, and another second semiconductor plug is formed at the other end of the second channel structure. As illustrated in FIG. 5K, semiconductor plugs 546 are formed on the upper ends of channel holes. In some embodiments, a semiconductor plug recess is formed by back-etching the upper portions of capping layer 519 using wet etching process and/or dry etching process. Semiconductor plugs 546 can be formed by depositing semiconductor materials, such as polysilicon, into the semiconductor plug recesses by one or more thin film deposition processes, such as CVD, PVD, ALD, electroplating, electroless plating, or any combination thereof. In some embodiments, a polysilicon CMP process is performed to remove the excess polysilicon deposition and planarize the top surface of semiconductor plugs 546 and memory stack 528. As a result, U-shaped memory strings are formed, each of which includes a pair of source channel structure 548-1 and drain channel structure 548-2 and corresponding semiconductor connection 538 connecting source and drain channel structures 548-1 and 548-2. Each source channel structure 548-1 can include upper semiconductor plug 546 as the source of the U-shaped NAND memory string and lower semiconductor plug 522 in contact with semiconductor connection 538. Each drain channel structure 548-2 can include upper semiconductor plug 546 as the drain of the U-shaped NAND memory string and lower semiconductor plug 522 in contact with semiconductor connection 538.

Figure 5L:
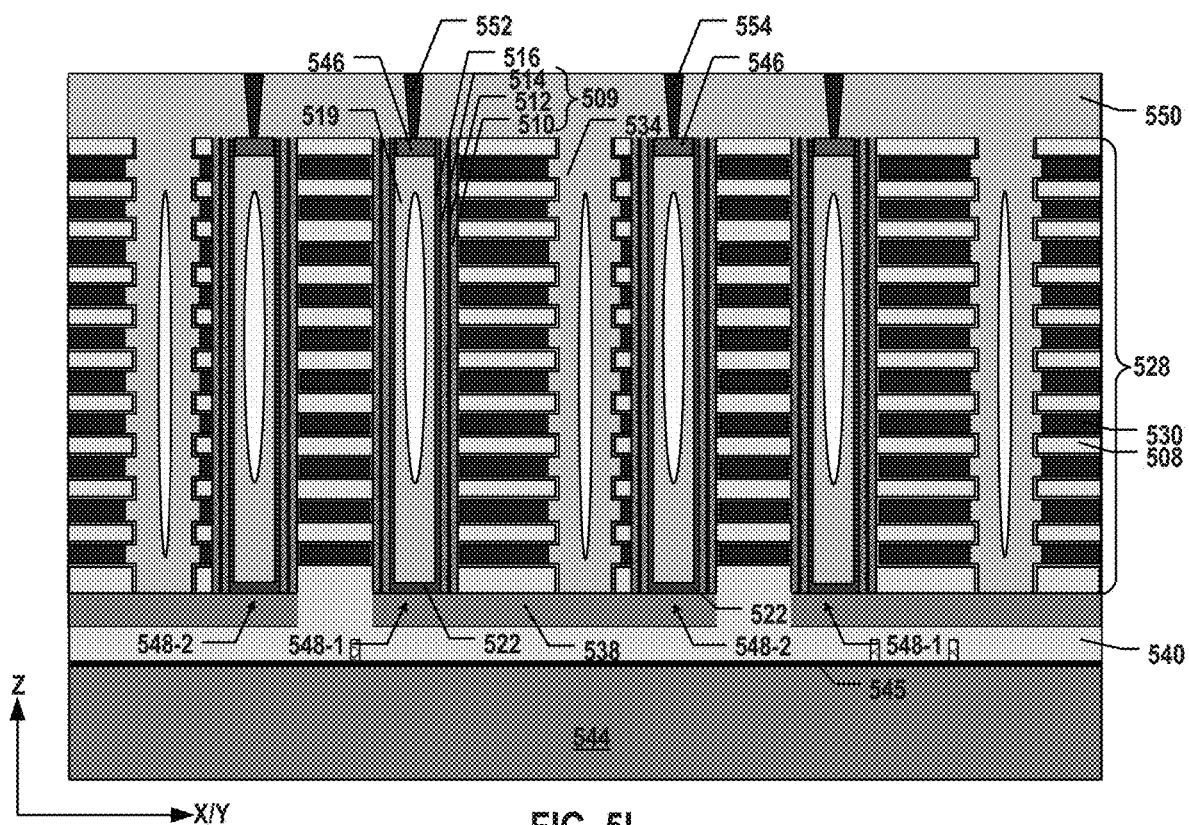

Method 600 proceeds to operation 614, as illustrated in FIG. 6, in which a bit line contact in contact with another first semiconductor plug of the first channel structure and a source line contact in contact with the other second semiconductor plug of the second channel structure are formed. As illustrated in FIG. 5L, source line contacts 552 and bit line contacts 554 are formed in one or more ILD layers 550. Each source line contact 552 can be above and in contact with upper semiconductor plug 546 (source) of source channel structure 548-1, and each bit line contact 554 can be above and in contact with upper semiconductor plug 546 (source) of drain channel structure 548-2. Source line contacts 552 and bit line contacts 554 can include conductive materials deposited by one or more thin film deposition processes including, but not limited to, CVD, PVD, ALD, electroplating, electroless plating, or any combination thereof. ILD layers 550 can include dielectric materials deposited by one or more thin film deposition processes including, but not limited to, CVD, PVD, ALD, or any combination thereof.

According to one aspect of the present disclosure, a 3D memory device includes a substrate and a memory stack including interleaved conductive layers and dielectric layers above the substrate. The 3D memory device also includes a slit structure extending vertically through the memory stack and extending laterally along a serpentine path to separate the memory stack into a first area and a second area. The 3D memory device further includes a plurality of first channel structures, each first channel structure extending vertically through the first area of the memory stack and including a drain at its upper end, and a plurality of second channel structures, each second channel structure extending vertically through the second area of the memory stack and including a source at its upper end. The 3D memory device further includes a plurality of semiconductor connections disposed vertically between the substrate and the memory stack. Each semiconductor connection crosses the slit structure in a plan view to electrically connect a respective pair of first channel structure and second channel structure.

In some embodiments, the first channel structures and the second channel structures are disposed on different sides of the slit structure in a first direction in which each semiconductor connection extends laterally in the plan view.

In some embodiments, the 3D memory device further includes a plurality of drain select gates configured to control the drains of the first channel structures, and a plurality of source select gates configured to control the sources of the second channel structures. The drain select gates and the source select gates are disposed on different sides of the memory stack in a second direction perpendicular to the first direction in the plan view, according to some embodiments.

In some embodiments, in the plan view, the first channel structures are disposed in four rows, and the second channel structures are disposed in four rows.

In some embodiments, each distance between the respective pair of first channel structure and second channel structure is nominally the same.

In some embodiments, the slit structure is filled with a dielectric.

In some embodiments, each of the first channel structures and the second channel structures includes a semiconductor plug at its lower end in contact with the corresponding semiconductor connection. The semiconductor plug and the semiconductor connection each includes polysilicon, according to some embodiments.

In some embodiments, the 3D memory device further includes a peripheral device disposed vertically between the substrate and the semiconductor connections.

In some embodiments, edges of the interleaved conductor layers and dielectric layers in a staircase structure of the memory stack along a vertical direction toward the substrate are staggered laterally toward the first and second channel structures.

In some embodiments, each conductor layer of the memory stack includes a metal.

In some embodiments, the 3D memory device further includes a bonding interface between the substrate and the semiconductor connections.

In some embodiments, the 3D memory device further includes a plurality of sub-slit structures each connected to the slit structure and extending in a first direction perpendicular to a second direction in which each semiconductor connection extends laterally in the plan view. In some embodiments, the plurality of sub-slit structures are disposed on different sides of the memory stack in the first direction. At least one of the sub-slit structures includes an "H" cut, according to some embodiments.

According to another aspect of the present disclosure, a 3D memory device includes a slit structure extending along a serpentine path in a plan view and an array of memory strings. Each memory string includes a first channel structure including a source at its upper end, a second channel structure including a drain at its upper end, and a semiconductor connection connecting lower ends of the first and second channel structures. In the plan view, the semiconductor connection crosses the slit structure, and the source and the drain of the memory string are separated by the slit structure in a column direction.

In some embodiments, a distance between the source and the drain of each memory string in the plan view is nominally the same.

In some embodiments, the 3D memory device further includes a plurality of drain select gates configured to control the drains of the array of memory strings, and a plurality of source select gates configured to control the sources of the array of memory strings. The drain select gates and the source select gates are separated by the slit structure in a row direction, according to some embodiment.

In some embodiments, every two sources and two drains alternate in each column of the array of memory strings.

In some embodiments, the slit structure is filled with a dielectric.

In some embodiments, the semiconductor connection includes polysilicon.

In some embodiments, the 3D memory device further includes a plurality of sub-slit structures each connected to the slit structure and extending in a row direction in the plan view. In some embodiments, the plurality of sub-slit structures are disposed on different sides of the memory stack in the row direction. At least one of the sub-slit structures includes an "H" cut, according to some embodiments.

According to still another aspect of the present disclosure, a 3D memory device includes a substrate, a bonding interface above the substrate, a semiconductor connection above the bonding interface, and a memory stack including interleaved conductor layers and dielectric layers above the semiconductor connection. The 3D memory device also includes a first channel structure and a second channel structure each extending vertically through the memory stack. A lower end of the first channel structure and a lower end of the second channel structure are in contact with the semiconductor connection. The 3D memory device further includes a bit line contact and a source line contact each above and in contact with an upper end of the first channel structure and an upper end of the second channel structure.

In some embodiments, the 3D memory device further includes an interconnect layer disposed vertically between the semiconductor connection and the bonding interface.

In some embodiments, the 3D memory device further includes a peripheral device on the substrate.

In some embodiments, the 3D memory device further includes a slit structure extending vertically through the memory stack to separate the conductor layers surrounding the first channel structure and the second channel structure.

In some embodiments, edges of the interleaved conductor layers and dielectric layers in a staircase structure of the memory stack along a vertical direction toward the substrate are staggered laterally toward the first and second channel structures.

In some embodiments, each of the first and second channel structures includes two semiconductor plugs at the upper and lower ends, respectively.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A three-dimensional (3D) memory device, comprising:
 a substrate;
 a memory stack comprising interleaved conductor layers and dielectric layers above the substrate;
 a slit structure extending vertically through the memory stack and extending laterally along a serpentine path to separate the memory stack into a first area and a second area;

a plurality of first channel structures, each first channel structure extending vertically through the first area of the memory stack and comprising a drain at its upper end;

a plurality of second channel structures, each second channel structure extending vertically through the second area of the memory stack and comprising a source at its upper end; and a plurality of semiconductor connections disposed vertically between the substrate and the memory stack, each semiconductor connection crossing the slit structure in a plan view to electrically connect a respective pair of first channel structure and second channel structure.

2. The 3D memory device of claim 1, wherein the first channel structures and the second channel structures are disposed on different sides of the slit structure in a first direction in which each semiconductor connection extends laterally in the plan view.

3. The 3D memory device of claim 2, further comprising:
a plurality of drain select gates configured to control the drains of the first channel structures; and
a plurality of source select gates configured to control the sources of the second channel structures,
wherein the drain select gates and the source select gates are disposed on different sides of the memory stack in a second direction perpendicular to the first direction in the plan view.

4. The 3D memory device of claim 1, wherein in the plan view, the first channel structures are disposed in four rows, and the second channel structures are disposed in four rows.

5. The 3D memory device of claim 1, wherein each distance between the respective pair of first channel structure and second channel structure is nominally the same.

6. The 3D memory device of claim 1, wherein the slit structure is filled with a dielectric.

7. The 3D memory device of claim 1, wherein each of the first channel structures and the second channel structures comprises a semiconductor plug at its lower end in contact with the corresponding semiconductor connection.

8. The 3D memory device of claim 7, wherein the semiconductor plug and the semiconductor connection each comprises polysilicon.

9. The 3D memory device of claim 1, further comprising a peripheral device disposed vertically between the substrate and the semiconductor connections.

10. The 3D memory device of claim 1, wherein edges of the interleaved conductor layers and dielectric layers in a staircase structure of the memory stack along a vertical direction toward the substrate are staggered laterally toward the first and second channel structures.

11. The 3D memory device of claim 1, wherein each conductor layer of the memory stack comprises a metal.

12. The 3D memory device of claim 1, further comprising a bonding interface between the substrate and the semiconductor connections.

13. A three-dimensional (3D) memory device, comprising:
a substrate;
a bonding interface above the substrate;
a semiconductor connection above the bonding interface;
a memory stack comprising interleaved conductor layers and dielectric layers above the semiconductor connection;
a first channel structure and a second channel structure each extending vertically through the memory stack, a lower end of the first channel structure and a lower end of the second channel structure being in contact with the semiconductor connection; and
a bit line contact and a source line contact each above and in contact with an upper end of the first channel structure and an upper end of the second channel structure.

14. The 3D memory device of claim 13, further comprising an interconnect layer disposed vertically between the semiconductor connection and the bonding interface.

15. The 3D memory device of claim 13, further comprising a peripheral device on the substrate.

16. The 3D memory device of claim 13, further comprising a slit structure extending vertically through the memory stack to separate conductor layers surrounding the first channel structure and the second channel structure.

17. The 3D memory device of claim 13, wherein edges of the interleaved conductor layers and dielectric layers in a staircase structure of the memory stack along a vertical direction toward the substrate are staggered laterally toward the first and second channel structures.

18. The 3D memory device of claim 13, wherein each of the first and second channel structures comprises two semiconductor plugs at the upper and lower ends, respectively.

19. The 3D memory device of claim 16, wherein the first channel structure and the second channel structure are disposed on different sides of the slit structure.

20. The 3D memory device of claim 16, wherein the slit structure is filled with a dielectric.

* * * * *